(12) United States Patent
Katakura

(10) Patent No.: US 11,670,388 B2
(45) Date of Patent: Jun. 6, 2023

(54) TRIMMING METHOD

(71) Applicant: FUJI ELECTRIC CO., LTD., Kanagawa (JP)

(72) Inventor: Hideaki Katakura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/356,591

(22) Filed: Jun. 24, 2021

(65) Prior Publication Data

US 2022/0068414 A1    Mar. 3, 2022

(30) Foreign Application Priority Data

Aug. 26, 2020   (JP) .............................. JP2020-143045

(51) Int. Cl.
*G11C 17/16* (2006.01)
*G11C 29/02* (2006.01)
*G11C 17/18* (2006.01)

(52) U.S. Cl.
CPC .............. *G11C 17/16* (2013.01); *G11C 17/18* (2013.01); *G11C 29/027* (2013.01); *G11C 29/028* (2013.01)

(58) Field of Classification Search
CPC ........ G11C 17/16; G11C 17/18; G11C 29/027; G11C 29/028
See application file for complete search history.

(56) References Cited

U.S. PATENT DOCUMENTS

| 2007/0171691 A1 | 7/2007 | Ashizawa | |
| 2014/0306750 A1* | 10/2014 | Toyoda | H01L 23/5256 327/525 |
| 2019/0319026 A1* | 10/2019 | Yoshida | H01L 29/0619 |

FOREIGN PATENT DOCUMENTS

| JP | 2006294903 A | * 10/2006 | ........... G09G 3/3648 |
| JP | 2007200387 A | 8/2007 | |
| JP | 2011138865 A | 7/2011 | |
| JP | 2018022848 A | 2/2018 | |

* cited by examiner

*Primary Examiner* — John W Poos
*Assistant Examiner* — Tyler J Pereny

(57) ABSTRACT

A trimming method for adjusting electrical characteristics of an adjustment circuit, which is provided in a semiconductor substrate, by cutting a fuse resistor provided in the semiconductor substrate. In a case where a cutting current flows to the fuse resistor to cut the fuse resistor, at least one of switching devices provided in the semiconductor substrate is set to a conductible state to make the cutting current flow to the switching device.

11 Claims, 16 Drawing Sheets

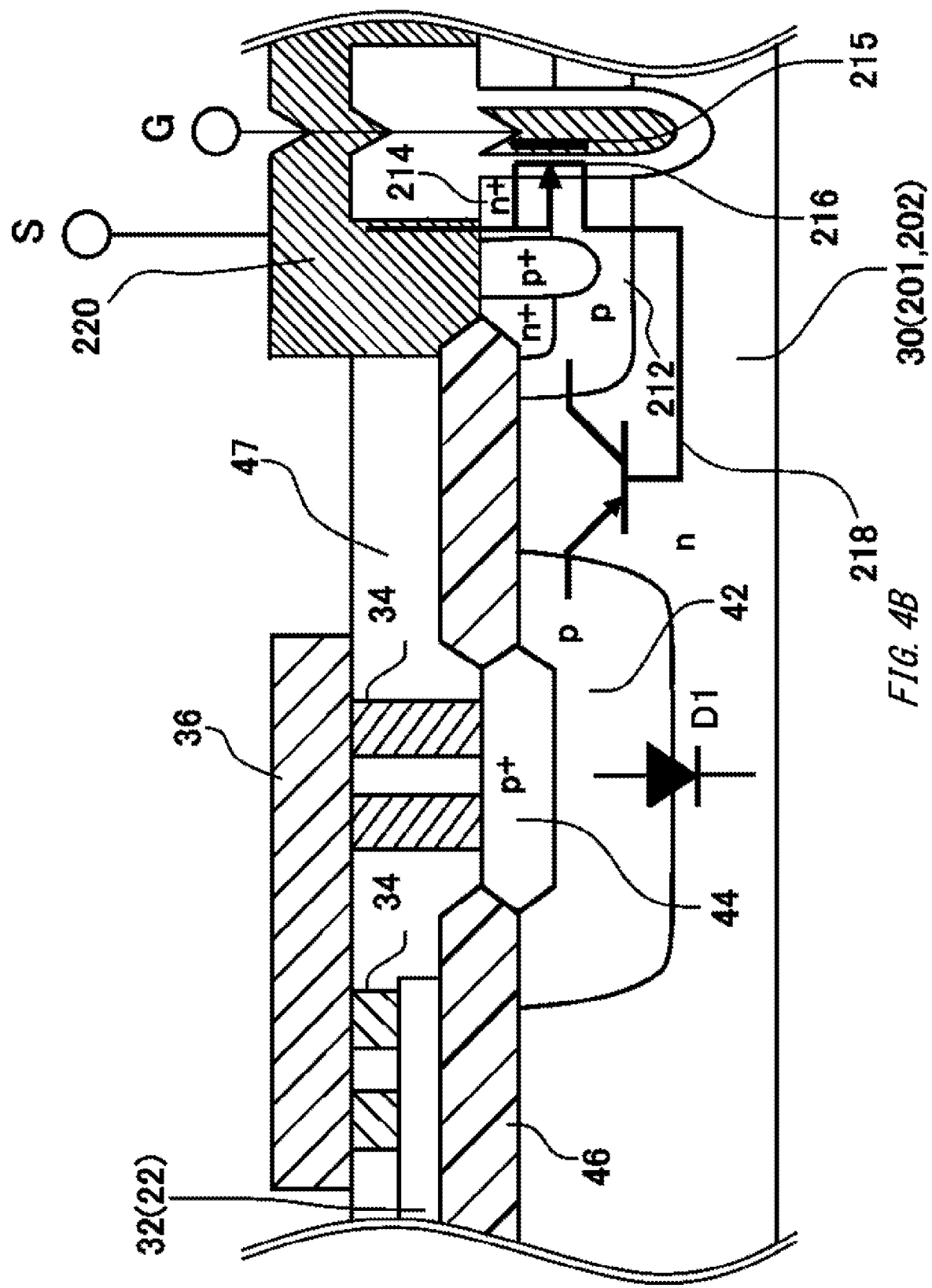

TRIMMING METHOD

BACKGROUND

1. Technical Field

The present invention relates to a trimming method.

A trimming circuit is used to compensate for fluctuations in circuit characteristics due to manufacturing variations in semiconductor devices. As a trimming circuit, a circuit provided with a fuse resistor formed by a polysilicon layer is known (for example, Patent Literature 1). There is known a trimming method in the trimming circuit which includes a fuse resistor and a reading transistor connected to each other in series, and a cutting transistor portion provided in parallel with the fuse resistor and the reading transistor, a pad is provided at a connection point between the fuse resistor and the reading transistor to make a current flow between the pad and the source of the cutting transistor portion so as to cut the fuse resistor (for example, Patent Literature 2).

CITATION LIST

Patent Literature

Patent Literature 1: Japanese Patent Application Publication No. 2018-22848
Patent Literature 2: Japanese Patent Application Publication No. 2007-200387

In the trimming method, it is desirable to reduce a leakage current by completely cutting the fuse resistor. In order to completely cut the fuse resistor, it is desirable to shorten the path of the cutting current flowing to cut the fuse resistor to short the rise time of the cutting current.

SUMMARY

One aspect of the invention is to provide a trimming method. In the trimming method, the electrical characteristics of an adjustment circuit provided in the semiconductor substrate may be adjusted by cutting the fuse resistor provided in the semiconductor substrate. In the trimming method, in a case where the cutting current flows to the fuse resistor to cut the fuse resistor, at least one of switching devices provided in the semiconductor substrate may be set to a conductible state to make the cutting current flow to the switching device.

The fuse resistor may be arranged in one surface of the semiconductor substrate via a dielectric film The switching device may be a part of a longitudinal device. The longitudinal device may control whether to make the current flow between a first main electrode provided in one surface of the semiconductor substrate and a second main electrode provided in another surface of the semiconductor substrate. In a case where the cutting current flows, the cutting current flown into the semiconductor substrate via the fuse resistor may flow to the first main electrode.

In the semiconductor substrate, a control element for controlling the longitudinal device may be provided. In a case where the cutting current flows, the control element may be set to a non-conduction state.

A conductivity type of the semiconductor substrate may be an n type. The switching device may include a p type base region which is formed on one surface side of the semiconductor substrate, an n type region which is formed in the base region, a conductive portion which is formed on the base region between the semiconductor substrate and the n type region via a dielectric film, and a first main electrode which is in contact with the n type region. A p type region may be provided which is formed separately from the p type base region on one surface side of the semiconductor substrate, and electrically connected to the fuse resistor.

The summary clause does not necessarily describe all necessary features of the embodiments of the present invention. The present invention may also be a sub-combination of the features described above.

BRIEF DESCRIPTION OF THE DRAWINGS

FIG. 4B is an enlarged cross-sectional view of Portion A in FIG. 4A.

DESCRIPTION OF EXEMPLARY EMBODIMENTS

Hereinafter, the invention will be described through embodiments, but the following embodiments do not limit the invention according to the claims. In addition, not all of the combinations of features described in the embodiments are essential to the solving means of the invention.

Figure 1:
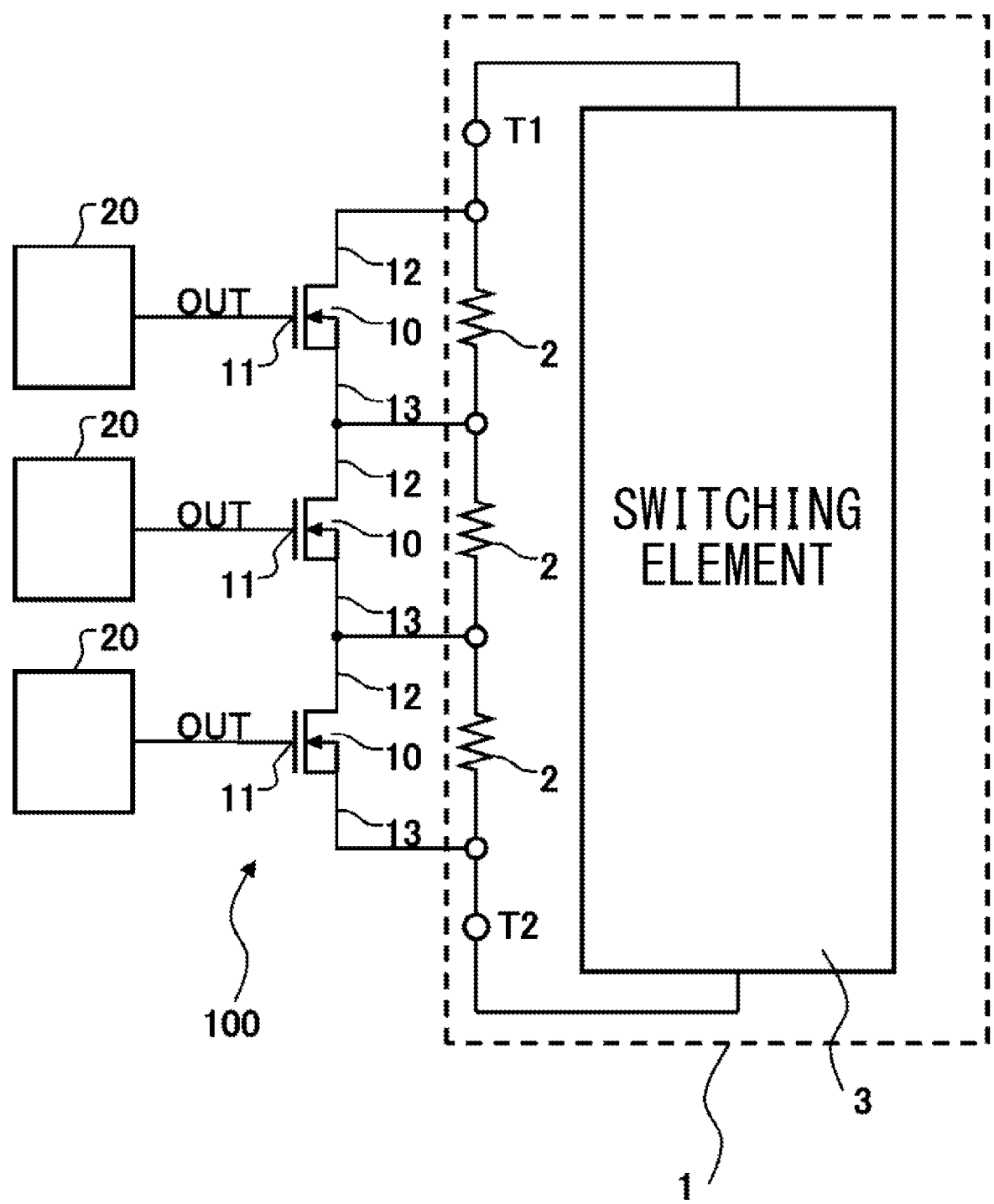
FIG. 1 is a diagram illustrating the outline configuration of a trimming circuit 100 to which a trimming method of an embodiment of the invention is applied.

FIG. 1 is a diagram illustrating the outline configuration of a trimming circuit 100 to which a trimming method of an embodiment of the invention is applied. The trimming circuit 100 adjusts electrical characteristics of an adjustment circuit 1. For example, the adjustment circuit 1 includes at least one adjustment element 2 and at least one switching device 3. The adjustment circuit 1 and the adjustment element 2 are provided in the same semiconductor substrate as the trimming circuit 100. The switching device 3 will be described later.

The trimming circuit 100 adjusts a resistance value between internal terminals T1 and T2 in one example. A resistor is connected between the internal terminals T1 and T2 as the adjustment element 2. In an example, a plurality of adjustment elements 2 may be connected in series between the internal terminals T1 and T2. The trimming circuit 100 may adjust the resistance value between the internal terminals T1 and T2 by switching whether both ends of each adjustment element 2 is short-circuited. The number of adjustment elements 2 and the resistance value thereof may be changed appropriately. However, the adjustment element 2 is not limited to a resistor, but may be other passive elements, or other active elements.

One or more adjustment elements 2 connected between the internal terminals T1 and T2 may be gate resistors to be connected to the gate of the switching device 3. The trimming circuit 100 may adjust the value of the gate resistance of the switching device 3 by adjusting the resistance value between the internal terminals T1 and T2. The switching device 3 may be a MOS type (Metal-Oxide-Semiconductor type) device such as a longitudinal MOSFET (Metal-Oxide-Semiconductor Field-Effect Transistor) and an IGBT (insulated gate bipolar transistor). The switching device 3 may be a power semiconductor device. The switching device 3 of this example is a MOSFET. However, the adjustment element 2 and the switching device 3 are not limited in this case. The adjustment element 2 may be an element for adjusting the characteristics of the switching device 3, or may be an element for adjusting the characteristics of a circuit element different from the switching device 3.

In this example, the trimming circuit 100 includes a main body portion 20 and a transistor portion 10. In this example, one main body portion 20 and one transistor portion 10 form one set. The trimming circuit 100 may include multiple sets of the main body portion 20 and the transistor portion 10. The set number of the main body portion 20 and the transistor portion 10 may be changed appropriately. As the set number of the main body portion 20 and the transistor portion 10 increases, the electrical characteristics such as the resistance and the current between the terminals T1 and T2 can be finely adjusted, and the adjustment accuracy can be improved.

The transistor portion 10 may be a MOS transistor. For example, the transistor portion 10 illustrated in FIG. 1 is an n-channel MOSFET. The adjustment element 2 is provided between a drain 12 and a source 13 of the transistor portion 10. That is, the adjustment element 2, whose electrical characteristics such as current are desired to be adjusted, and the transistor portion 10 are connected in parallel. A gate 11 of the transistor portion 10 may be electrically connected to an output terminal OUT of the main body portion 20. The transistor portion 10 is formed in the semiconductor substrate. A control terminal of the transistor portion 10 is connected to the output terminal OUT of the main body portion 20. The control terminal may be a gate terminal.

In this example, when the output terminal OUT of the main body portion 20 becomes a Lo level, that is, a low level, the transistor portion 10 turns off. Thereby, both ends of the corresponding adjustment element 2 are not short-circuited. On the other hand, when the output terminal OUT of the main body portion 20 becomes a Hi level, that is, a high level, the transistor portion 10 turns on. When the transistor portion 10 turns on, both ends of the corresponding adjustment element 2 are short-circuited. However, not limited to this case, the transistor portion 10 may be configured such that, when the output terminal OUT of the main body portion 20 becomes the Lo level, the transistor portion 10 turns on, and when the output terminal OUT of the main body portion 20 becomes the Hi level, the transistor portion 10 turns off.

Figure 2:
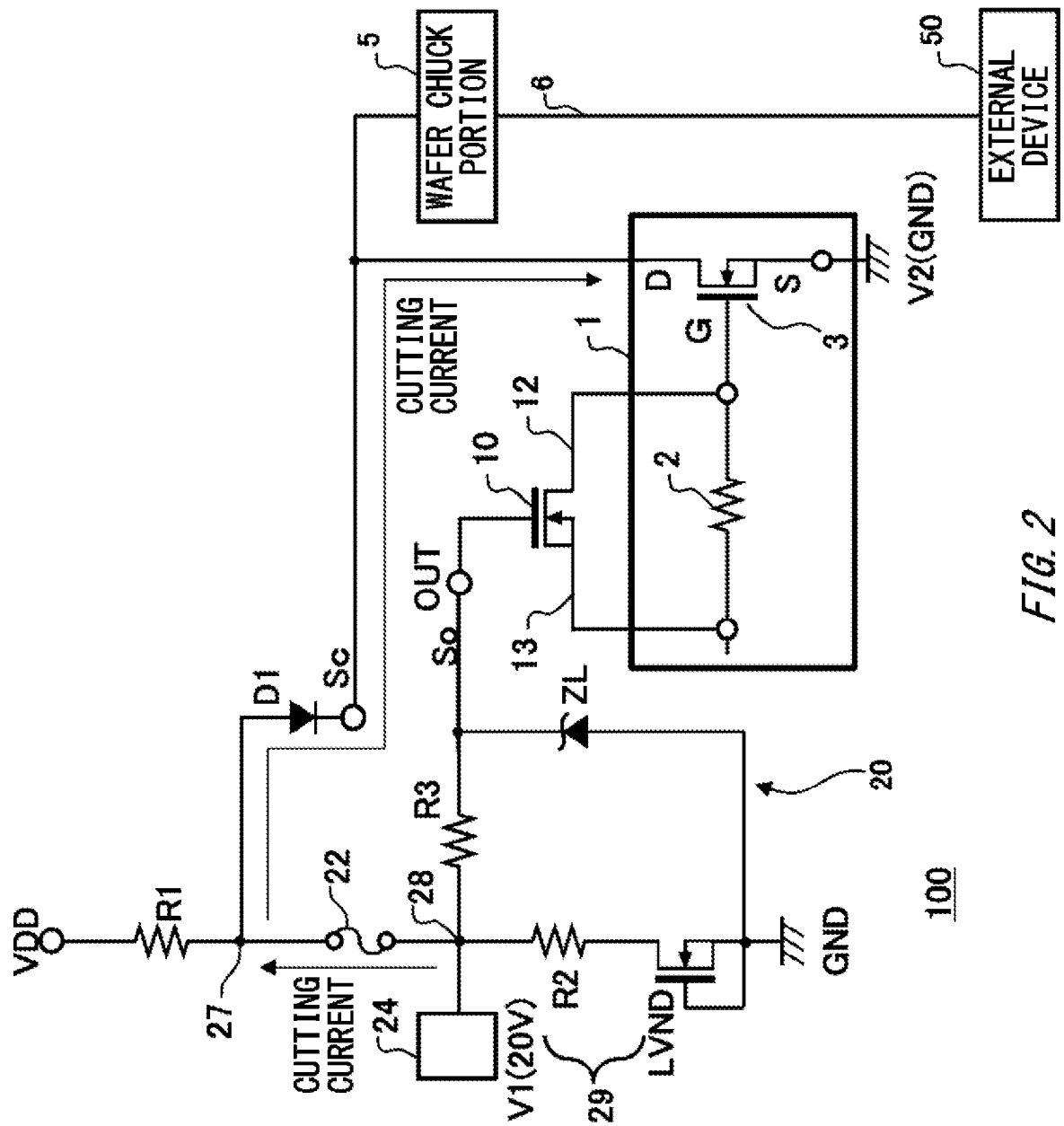
FIG. 2 is an example of a circuit diagram to which the trimming method of an embodiment of the invention is applied.

FIG. 2 is an example of the circuit diagram to which the trimming method of an embodiment of the invention is applied. The trimming method is a trimming method of adjusting the electrical characteristics of the adjustment circuit 1, which is provided in the semiconductor substrate, by cutting a fuse resistor 22 provided in the semiconductor substrate.

The trimming circuit 100 includes the fuse resistor 22, a pad 24 for trimming, a first diode D1, and the output terminal OUT. The trimming circuit 100 may include a first resistance element R1, a second resistance portion 29, a third resistance element R3, and a protection diode ZL. The first resistance element R1 is an example of a first resistance portion. The second resistance portion 29 of this example may include a second resistance element R2 and a resistance element LVND. The resistance element LVND is a high resistance element using a transistor. In this example, the second resistance element R2 and the resistance element LVND are connected in series. The third resistance element R3 is an example of a third resistance portion. However, the first resistance portion, and the second resistance portion, and the third resistance portion are not limited to these cases.

The trimming circuit 100 is a circuit which outputs a voltage So according to the presence or absence of cutting of the fuse resistor 22 to the output terminal OUT. The trimming circuit 100 changes the voltage So to be applied to the output terminal OUT according to the cutting of the fuse resistor 22 to determine the ON/OFF of the transistor portion 10 as described above. In addition, even in a case where a virtual cutting is executed to generate a state where the fuse resistor 22 is virtually cut, the trimming circuit 100 changes the voltage So.

One end of the fuse resistor 22 is connected to the pad 24 at a connection point 28. The other end of the fuse resistor 22 is connected to one end of the first diode D1 at a connection point 27. In this example, the other end of the fuse resistor 22 is connected to the anode of the first diode D1. The output terminal OUT is electrically connected to the connection point 28 between the fuse resistor 22 and the pad 24. In this example, the output terminal OUT is electrically connected to the connection point 28 via the third resistance element R3. The output terminal OUT outputs a voltage according to the presence or absence of cutting of the fuse resistor 22.

One end of the first resistance element R1 is connected to the connection point 27 between the fuse resistor 22 and the anode of the first diode D1. The other end of the first resistance element R1 is connected to VDD which is a third potential V3. One end of the second resistance portion 29 is connected to the connection point 28 between one end of the fuse resistor 22 and the pad 24. The other end of the second resistance portion 29 is connected to GND which is a fourth potential V4. That is, one end of the fuse resistor 22 is connected to the fourth potential V4 via the second resistance portion 29. In this example, the second resistance element R2 is connected to the connection point 28, the resistance element LVND is connected to the fourth potential V4. However, conversely, the resistance element LVND may be connected to the connection point 28, and the second resistance element R2 may be connected to the fourth potential V4.

In this example, the third potential V3 is a higher potential than the fourth potential V4. In this example, the fourth potential V4 corresponds to the potential (ground potential) of a ground wiring GND, and the third potential V3 corresponds to the potential of a high potential wiring VDD. That is, the other end of the fuse resistor 22 may be connected to the high potential wiring VDD via the first resistance element R1. The fourth potential V4 may be the Lo level substantially equal to the ground potential, and the third potential V3 may be the Hi level substantially equal to the potential of the high potential wiring VDD.

The other end of the second resistance portion 29, in particular the gate and drain of the resistance element LVND, may be connected to the ground wiring GND. The connection point 27 of this example is a point nearer to the high potential wiring VDD than the connection point 28. The connection point 27 may be arranged between the fuse resistor 22 and the high potential wiring VDD. The connection point 28 may be arranged between the fuse resistor 22 and the ground wiring GND.

The protection diode ZL is connected between the other end of the second resistance portion 29 and the output terminal OUT. In this example, the anode of the protection diode ZL is connected to the ground wiring GND which is the fourth potential V4, and the cathode of the protection diode ZL is connected to the output terminal OUT.

The output terminal OUT is connected to the control terminal of the transistor portion 10. In this example, the control terminal is a gate terminal of the transistor portion. In FIG. 2, one transistor portion 10 and one adjustment element 2 are illustrated for the simplicity of explanation, but as illustrated in FIG. 1, a set of transistor portions 10 and adjustment elements 2 may be provided. The adjustment element 2 is provided between the drain 12 and the source 13 of the transistor portion 10.

In this example, one or more adjustment elements 2 are connected to the gate of the switching device 3, and function as a gate resistor. In this example, one or more switching devices 3 are included in the adjustment circuit 1.

The fuse resistor 22, the pad 24 for trimming, the first diode D1, the first resistance element R1, the second resistance portion 29, the third resistance element R3, the protection diode ZL, the transistor portion 10, and the adjustment circuit 1 may be formed on the same semiconductor substrate. The fuse resistor 22 is, for example, a polysilicon fuse which is formed by a polysilicon layer. The first diode D1 has a semiconductor region of a second conductivity type in the semiconductor substrate of a first conductivity type. In an example, the first conductivity type is an n type, and the second conductivity type is a p type.

One end of the first diode D1 may be electrically connected to one switching device or at least one of a plurality of switching devices 3 on the same semiconductor substrate as the fuse resistor 22. In this example, one end of the first diode D1 is electrically connected to the switching device 3 which is included in the adjustment circuit 1. The semiconductor substrate is connected to an external device 50 via a wafer chuck portion 5 and an external cable 6 which are arranged in the lower surface. The external device 50 is a wafer tester for testing electrical characteristics after completing wafer processing in an example. The wafer chuck portion 5 may be a stage in which the wafer is vacuum-adsorbed and fixed. At least a part of the wafer chuck portion 5 is electrically connected to the lower surface of the semiconductor substrate. A voltage to be applied to the wafer chuck portion 5 can be adjusted to any value by the external device 50. Alternatively, the wafer chuck portion 5 can be electrically disconnected from the power source of the external device 50. During normal operation of the semiconductor device, the voltage of the lower surface of the semiconductor substrate is higher than the VDD potential, and the first diode D1 is in a reverse bias state and no current flows. An external pad is connected to the gate of the switching device 3, and any voltage Vg can be applied thereto by the wafer tester.

The first resistance element R1 is a pull-up resistor for pulling up (dividing) the output terminal OUT to the potential of the high potential wiring VDD in a state where the trimming circuit 100 does not execute trimming, and is also a current limit resistor for limiting the current flowing to the fuse resistor 22. On the other hand, the second resistance portion 29 is a pull-down resistor for pulling down (dividing) the output terminal OUT to the ground potential in a state where the fuse resistor 22 is cut. The second resistance portion 29 and the third resistance element R3 are also current limit resistors for limiting the current flowing to the fuse resistor 22. The resistance values of the first resistance element R1, the second resistance portion 29, and the third resistance element R3 may be adjusted so that the voltage So to be applied to the output terminal OUT becomes a level at which the transistor portion 10 turns on in a state where the trimming is not executed, that is, a state where the fuse resistor 22 is not cut.

[During Non-Trimming]

In a state where the trimming circuit 100 does not execute the trimming, the output voltage So of the output terminal OUT is pulled up (divided) by the high potential wiring VDD. In an example, the voltage applied to the high potential wiring VDD is divided by the first resistance element R1 and the second resistance portion 29. For example, the output terminal OUT is applied with the voltage So (a voltage higher than a threshold voltage of a transistor constituting the transistor portion 10) of the Hi level. Thereby, the transistor portion 10 which is a MOSFET for current adjustment is turned on, and both ends of the corresponding adjustment element 2 keep the short-circuit state.

[During Virtual Cutting]

The trimming circuit 100 can execute a virtual cutting in order to confirm the electrical characteristics of the adjustment circuit 1 after cutting the fuse resistor 22. The trimming circuit 100 generates a state where the fuse resistor 22 is virtually cut. In a case where the trimming circuit 100 executes the virtual cutting, a voltage Sp to be applied to the pad 24 for trimming may be adjusted.

[During Normal Cutting]

In a case where a cutting current flows to the fuse resistor 22 to cut the fuse resistor 22, the trimming method of this example sets at least one of one or more switching devices 3 provided in the semiconductor substrate to a conductible state. The cutting current means a current flowing to the fuse resistor 22 in order to cut the fuse resistor 22 by Joule heat.

In this example, the switching device 3 enters a conductible state by applying a gate voltage Vg of the Hi level (high level) equal to or more than the threshold voltage to the gate electrode of the switching device 3. The applied gate voltage Vg is, for example, 5 V. However, not limited to this case, the switching device 3 may be configured such that the switching device 3 enters a conductible state when the gate voltage Vg of the Lo level (low level) equal to or less than the threshold voltage is applied to the gate electrode of the switching device 3.

In the trimming method of this example, in a case where the cutting current is caused to flow to the fuse resistor 22 to cut the fuse resistor 22, first the switching device 3 enters the conductible state. Next, the wafer chuck portion 5 is floated. Next, the potential to be applied to the pad 24 and the potential to be applied to a first main electrode of the switching device 3 are adjusted to make the forward current flow to the first diode D1. In this example, a first potential V1 is applied to the pad 24 for trimming, and a second potential V2 is applied to the first main electrode of the switching device 3. The first potential V1 and the second potential V2 are different potentials. In this example, the first potential V1 is higher than the second potential V2. In this example, the first main electrode is a source electrode S.

In this example, an external voltage source or an internal voltage source may apply the first potential V1 higher than third potential V3, which is applied to the high potential wiring VDD, to the pad 24 for trimming. Then, the source electrode which is the first main electrode of the switching device 3 is connected to the second potential V2, for example, the ground potential.

For example, a voltage of 10 V or more and 30 V or less is applied to the pad 24 by the external voltage source or the internal voltage source. Thereby, the current flows to the fuse resistor 22, and the fuse resistor 22 is cut by Joule heat. For example, a voltage is applied to the pad 24 by the external voltage source of the wafer tester for inspecting the semiconductor device.

Since the first diode D1 is connected in the forward direction, the cutting current which is the forward current flows to the semiconductor substrate through the fuse resistor 22 and the first diode D1. Then, at least one of the switching devices 3 provided in the semiconductor substrate is set to the conductible state, the cutting current flows to the switching device 3. According to this example, a sufficient current can flow to cut the fuse resistor 22 without being affected by the first resistance element R1 and the second resistance portion 29.

In another example, in a case where the fuse resistor 22 is cut, the fourth potential V4 (in this example, the ground potential) to which the second resistance portion 29 is connected may be adjusted. In an example, in a case where a voltage to cut the fuse resistor 22 is applied to the pad 24, the fourth potential V4 may be increased compared to the case where the voltage is not applied to the pad 24. Thereby, it is possible to suppress the flow of current from the pad 24 to the second resistance portion 29. In a case where a voltage for cutting the fuse resistor 22 is applied to the pad 24, a fourth ground potential V4 may be higher than the second potential V2. The fourth potential V4 may be set to the same potential as the high potential wiring VDD. Thereby, the current easily flows to the fuse resistor 22, and can easily cut the fuse resistor 22.

In the cutting stage of the fuse resistor 22 in the trimming method of this example, the cutting current flows in the order of the pad 24, the fuse resistor 22, the first diode D1, and the switching device 3. That is, the cutting current flowing to cut the fuse resistor 22 flows to the switching device 3 by making the switching device 3 enter the conductible state.

After trimming, the trimming circuit 100 is in a state where the fuse resistor 22 is cut. In a state where the fuse resistor 22 is cut, the second resistance portion 29 pulls down the output terminal OUT to the ground potential. The voltage So of the Lo level is applied to the output terminal OUT. Thereby, the transistor portion 10 which is a MOSFET for current adjustment is turned off, and both ends of the corresponding adjustment element 2 change to a state where both ends are not short-circuited.

Figure 3:
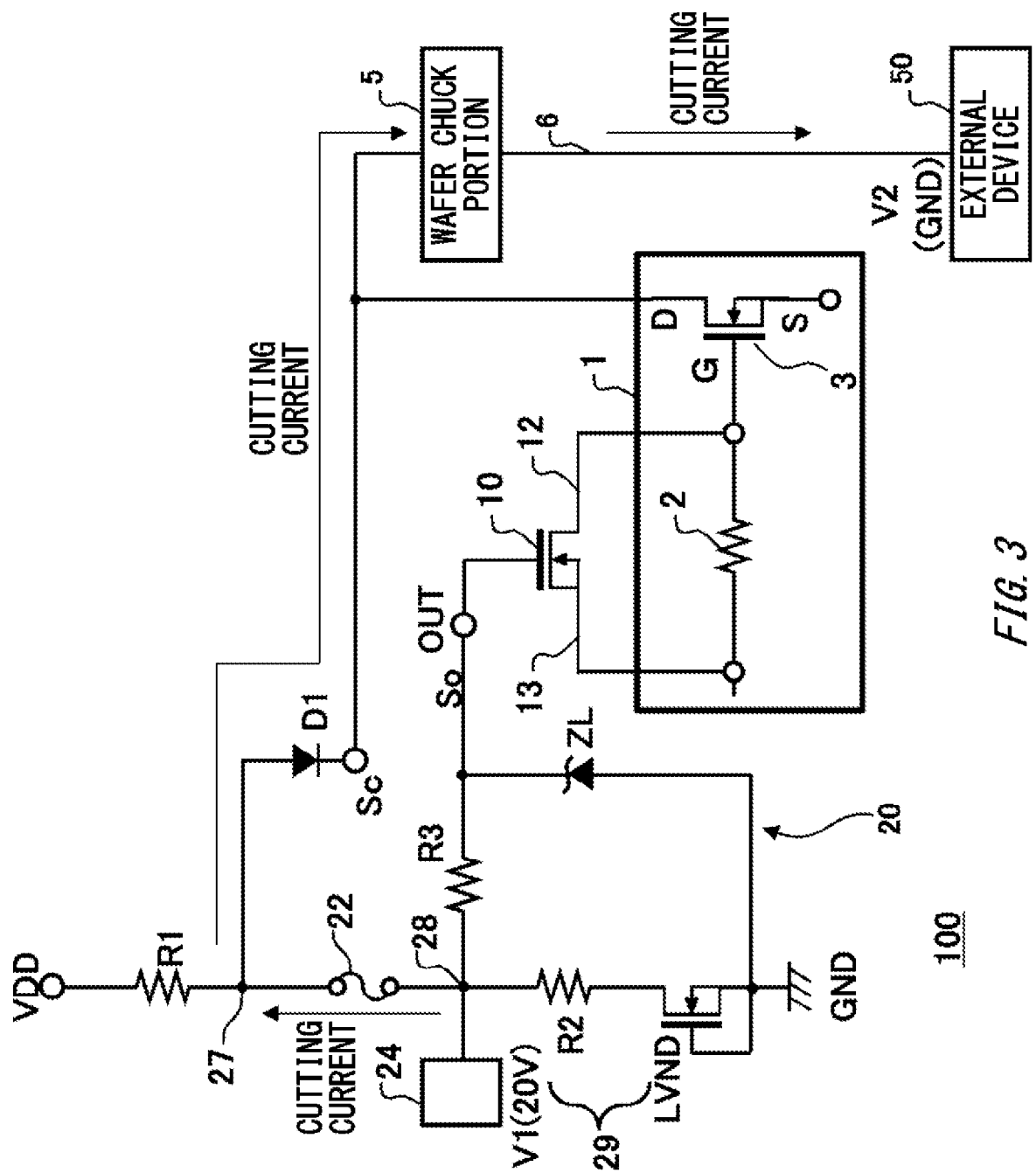
FIG. 3 is an example of a circuit diagram to which the trimming method of a comparative example is applied.

FIG. 3 is an example of a circuit diagram to which the trimming method of a comparative example is applied. In the trimming method of the comparative example, in a case where the cutting current flows to the fuse resistor 22 to cut the fuse resistor, the lower surface of the semiconductor substrate is connected to the external device 50 via the wafer chuck portion 5 and the external cable 6 which are arranged in the lower surface. The external device 50 is a wafer tester for testing electrical characteristics after completing wafer processing in an example. The wafer chuck portion 5 may be a stage in which the wafer is vacuum-adsorbed and fixed. At least a part of the wafer chuck portion 5 is electrically connected to the lower surface of the semiconductor substrate. Then, the external cable 6 connects the lower surface of the semiconductor substrate where the trimming circuit 100 and the adjustment circuit 1 are provided to a ground electrode of the external device 50.

In the cutting stage of the fuse resistor 22 in the trimming method of the comparative example, the cutting current flows in the order of the pad 24, the fuse resistor 22, the first diode D1, the electrode of the lower surface of the substrate, the wafer chuck portion 5, and the external cable 6. That is, the cutting current flowing for cutting the fuse resistor 22 flows through the wafer chuck portion 5 and the external cable 6.

Figure 4A:
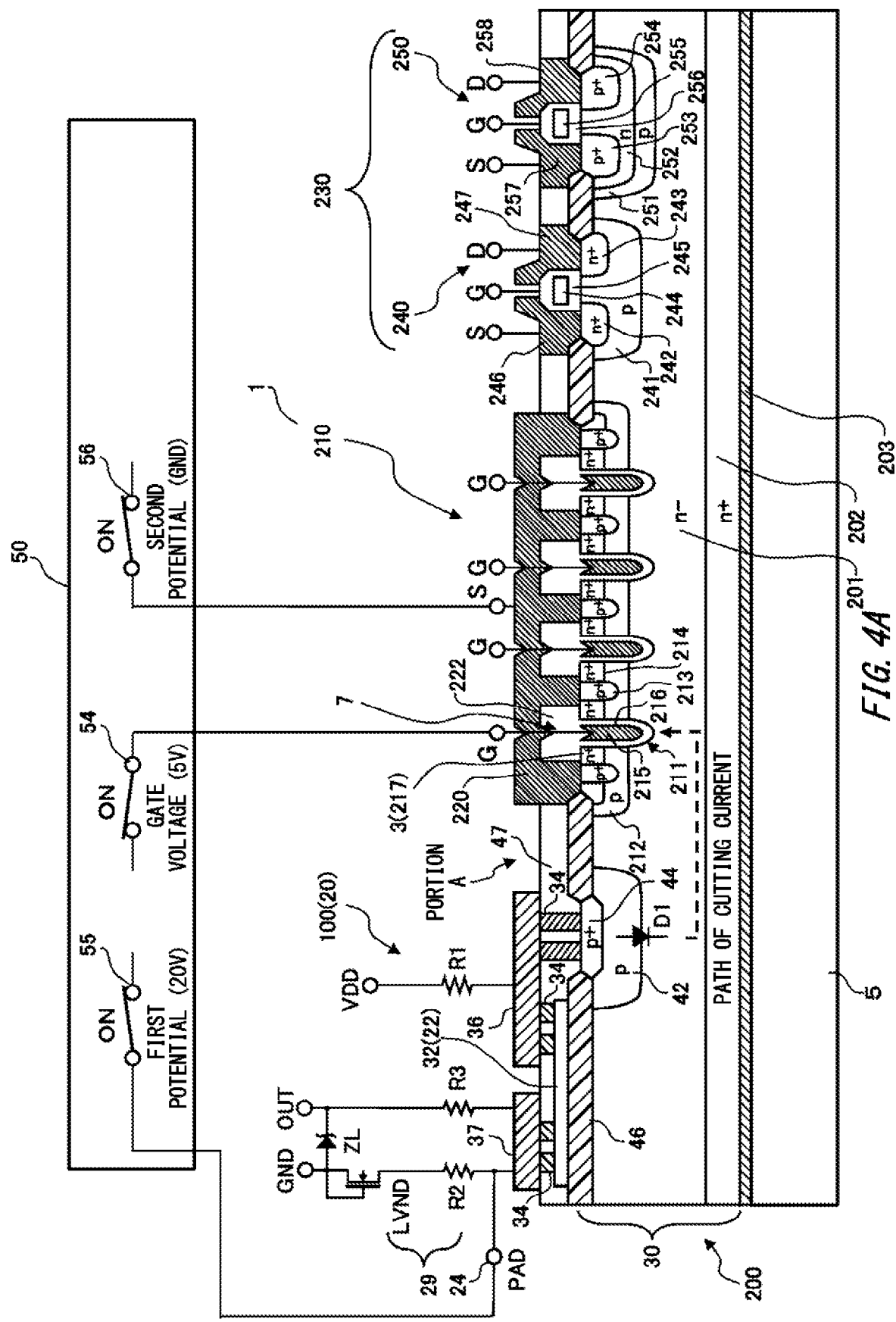
FIG. 4A is a cross-sectional view illustrating an example of a semiconductor device to which the trimming method in FIG. 2 is applied.

In the comparative example illustrated in FIG. 3, the cutting current is affected by the impedance of the wafer chuck portion 5 and the external cable 6, for example, parasitic capacitance. Specifically, in the trimming method of the comparative example, the rise of the cutting current at the time of cutting is later than the rise of the cutting current in the trimming method of this embodiment illustrated in FIG. 2. When the rise of the cutting current is late, only a part of the fuse resistor 22 formed of polysilicon is heated, which results in insufficient cutting, and thus the leakage current after trimming may increase. In addition, heat is transmitted around the fuse resistor 22 formed of polysilicon, and there is a risk of affecting the quality of the protective film such as an interlayer dielectric film FIG. 4A is a cross-sectional view illustrating an example of a semiconductor device 200 to which the trimming method of the embodiment in FIG. 2 is applied. FIG. 4B is an enlarged cross-sectional view in which Portion A of FIG. 4A is enlarged. The trimming method of this embodiment can be applied to various semiconductor devices 200. The semiconductor device 200 includes the adjustment circuit 1 and the trimming circuit 100. The adjustment circuit 1 and the trimming circuit 100 are provided on the same semiconductor substrate 30. In FIGS. 4A and 4B, for the simplicity of explanation, only electrical connection relationships are shown by circuit symbols for the first resistance element R1, the second resistance portion 29, the third resistance element R3, and the protection diode ZL which are included in the trimming circuit 100. In addition, in FIGS. 4A and 4B, for the simplicity of explanation, the transistor portion 10 is omitted and the main body portion 20 is illustrated out of the trimming circuit 100.

The adjustment circuit 1 of this example may include an output stage circuit portion 210 which is formed in the upper surface of the same the semiconductor substrate 30. The semiconductor device 200 may include a control circuit portion 230. The control circuit portion 230 may also be included in the adjustment circuit 1.

The output stage circuit portion 210 may include a plurality of switching devices 3 illustrated in FIG. 1. In other words, the switching device 3 may be a part of an output transistor which outputs the current to the outside of the semiconductor device 200. The switching device 3 may be provided on one surface side of the semiconductor substrate 30, that is, the front surface side. The output stage circuit portion 210 may include a trench gate type power semiconductor device. The output stage circuit portion 210 may include a longitudinal device 7 as an output transistor in which the switching device 3 is a part of the component.

The longitudinal device 7 is a device which controls whether to make the current flow between the first main electrode provided in one surface (the upper surface in the drawing) of the semiconductor substrate 30 and a second main electrode provided in the other surface (the lower surface in the drawing) of the semiconductor substrate 30. The longitudinal device 7 may include a longitudinal MOSFET or an IGBT. In this example, the longitudinal device 7 is a longitudinal MOSFET which has a trench gate.

The semiconductor device 200 may be a power integrated circuit in which the output stage circuit portion 210 which can flow a large current and the control circuit portion 230 are mounted on one semiconductor chip. In a case where the electrical characteristics are deviated from a target range after completion of the wafer process of the semiconductor device 200, the polysilicon fuse resistor 22 of the trimming circuit 100 is cut using the wafer tester so that the electrical characteristics can be adjusted to fall within the target range. The fuse resistor 22 used in the trimming circuit can be cut by irradiating laser or by making the cutting current flow, but if the method of making the cutting current flow as in this example is employed, a laser irradiation device is not required. The wafer tester which executes a test of the electrical characteristics after completion of the wafer process can also be used as an external device for trimming In this example, the conductivity type of the semiconductor substrate 30 is an n type. The semiconductor substrate 30 includes an n− type drift layer 201. In the lower surface of the semiconductor substrate 30, an n+ type layer as a contact layer 202 is formed by impurity diffusion or the like. A second main electrode 203 is formed in the contact layer 202. The second main electrode 203 is formed of a conductive material such as metal. In this example, the second main electrode 203 is a drain electrode. Further, among the main surfaces of the semiconductor substrate 30, the lower surface where the second main electrode 203 is formed is also called a back surface, and the upper surface on the opposite side of the lower surface is also called a front surface. The contact layer 202 functions as a drain layer of the longitudinal device 7. The second main electrode 203 functions as the drain electrode of the longitudinal device 7.

A p type base region 212 is formed on one surface side of the semiconductor substrate 30. In the p type base region 212, a p+ type region 213 and an n+ type region 214 are formed. These regions are formed by impurity diffusion or the like. A trench gate 211 is formed in the semiconductor substrate 30.

The trench gate 211 is dug in from one surface of the semiconductor substrate. The trench gate 211 reaches the n− type drift layer 201 through the p type base region 212. The trench gate 211 includes a conductive portion 215 filled in a trench, and a dielectric film 216 which electrically separates the conductive portion 215 from the semiconductor substrate 30. The trench is in contact with the n+ type region 214, and the p type base region 212 and the n− type drift layer 201. The conductive portion 215 may be formed at least in the surface of the p type base region 212 between the n+ type region 214 and the n− type drift layer 201 via the dielectric film 216. A first main electrode 220 is formed to be in contact with the p+ type region 213 and the n+ type region 214. The first main electrode 220 is formed of a conductive material. In this example, the first main electrode 220 is a source electrode. A dielectric film 222 is formed above the trench gate 211. The dielectric film 222 insulates the trench gate 211 and the first main electrode 220.

The switching device 3 may include the n+ type region 214, the p type base region 212, the n− type drift layer 201, the trench gate 211, and the first main electrode 220. The switching device 3 may be a MOS portion 217 of the longitudinal device 7. The n+ type region 214, the p type base region 212, the n− type drift layer 201, the trench gate 211, and the first main electrode 220 function as the source region, the base region, the drift layer, and gate and source electrodes of the longitudinal device 7, respectively. The MOS portion 217 may be a portion which includes the source region, the base region, the drift layer, and the gate and source electrodes of the longitudinal device 7, or may not include the drain layer and the drain electrode of the longitudinal device 7.

Further, the MOS portion 217 may include a planar gate instead of the trench gate. The planar gate is formed in one surface of the semiconductor substrate via a dielectric film Specifically, the planar gate is formed on the surface of the p type base region 212, which is sandwiched between the n+ type region 214 and the n− type drift layer 201, via a dielectric film Further, in the invention, "n" shown as a component means that majority carriers are electrons, and "p" means that majority carriers are holes. "+" means that the impurity concentration is relatively high, and "−" means that the impurity concentration is relatively low.

The trimming circuit 100 sets the MOS portion 217, which is the switching device 3, to the conductible state in a case where the cutting current flows. That is, a voltage is applied to the conductive portion 215 of the trench gate 211 of the MOS portion 217, and a channel is formed in the p type base region 212 between the n− type drift layer 201 and the n+ type region 214. When the MOS portion 217 is set to the conductible state, the cutting current flowing in the semiconductor substrate 30 via the fuse resistor 22 flows to the first main electrode 220 via the MOS portion 217. In addition, the trimming circuit 100 may include a plurality of switching devices 3. The trimming circuit 100 may set all the MOS portions 217 of the plurality of power semiconductor devices to the conductible state in a case where the cutting current flows, or may set the MOS portions 217 of some of the power semiconductor devices to the conductible state. In a case where the fuse resistor 22 is cut by making the cutting current flow, the wafer chuck portion 5 may be floated.

The control circuit portion 230 may include a CMOS circuit portion in which an n-channel MOS transistor 240 and a p-channel MOS transistor 250 are combined on the front surface side of the semiconductor substrate 30. The n-channel MOS transistor 240 has a p well region 241 which is formed in the n type semiconductor substrate 30. Then, an n+ type source region 242 and a drain region 243 each are formed in the p well region 241.

A source electrode 246 is connected to the source region 242, and a drain electrode 247 is connected to the drain region 243. The source electrode 246 and the drain electrode 247 are formed of a conductive material such as metal. A gate electrode 244 is formed on the front surface of the semiconductor substrate 30 via a gate dielectric film 245. The source region 242 is provided on one side of the gate electrode 244, and the drain region 243 is provided on the other side of the gate electrode 244.

The p-channel MOS transistor 250 has a p well region 251 formed in the n type semiconductor substrate 30, and has an n well region 252 in the p well region 251. A p+ type source region 253 and a drain region 254 each are formed in the n well region 252. A source electrode 257 is connected to the source region 253, and a drain electrode 258 is connected to the drain region 254. A gate electrode 255 is provided on the front surface of the semiconductor substrate 30 via a gate dielectric film 256.

The control circuit portion 230 may be a control element for controlling the longitudinal device 7. In a case where the cutting current of this embodiment flows, the control circuit portion 230 may be set to a non-conduction state. In this case, the current which is equal to or more than a preset value can be prevented from flowing to the control circuit portion 230 in advance by turning off the control circuit portion 230 which is not a power semiconductor device. Therefore, it is possible to prevent the control circuit portion 230 from being damaged.

In the trimming circuit 100, the first diode D1 and the fuse resistor 22 are formed in the semiconductor substrate 30. The fuse resistor 22 is arranged in the upper surface of the semiconductor substrate 30 via a dielectric film 46. The dielectric film 46 is partially provided on the semiconductor substrate 30. The dielectric film 46 may be a LOCOS oxide film. The fuse resistor 22 is formed by a polysilicon layer 32.

As illustrated in FIG. 4B, a first semiconductor region 42 of the second conductivity type is formed on one surface of the semiconductor substrate 30. In an example, the first semiconductor region 42 is a p type region which is formed in the n type semiconductor substrate 30 by impurity diffusion or the like. The first semiconductor region 42 is formed separately from the p type base region 212. The first semiconductor region 42 is electrically connected to the fuse resistor 22. A PN junction is formed by the first semiconductor region 42 and the semiconductor substrate 30. The PN junction functions as the first diode D1. The first diode D1 may be a longitudinal diode. In this specification, the longitudinal diode is a diode which makes the current flow in the thickness direction of the semiconductor substrate 30. In this example, the anode is arranged on the upper surface side of the semiconductor substrate 30, and the cathode is arranged inside the semiconductor substrate 30.

In a case where the cutting current flows to the fuse resistor 22 to cut the fuse resistor 22, the current originally flows from the first diode D1, which is the longitudinal diode, to the switching device 3 which is the MOS portion 217 of a longitudinal MOSFET. Thereby, the p type region of the first diode D1, and the switching device 3 which is the MOS portion 217 of the semiconductor substrate 30 and the longitudinal device 7 function as a lateral IGBT 218. Specifically, the lateral IGBT 218 includes the first semiconductor region 42 (p type region), the semiconductor substrate 30 (the drift layer 201), the p type base region 212, and the n+ type region 214 (n type region) as components.

In a part of the first semiconductor region 42, a second semiconductor region 44 of the second conductivity type may be formed by impurity diffusion or the like. The second semiconductor region 44 has an impurity concentration higher than that of the first semiconductor region 42. In an example, the second semiconductor region 44 is a p+ region.

A contact portion 34 is connected to the second semiconductor region 44 of the second conductivity type. The contact portion 34 may be formed of a conductive material. One end of the fuse resistor 22 is connected to a metal wiring 36 via the contact portion 34.

In a region in the first diode D1 where the second semiconductor region 44 is formed, the dielectric film 46 is removed partially, and the second semiconductor region 44 is partially exposed. The second semiconductor region 44 is connected to the metal wiring 36 via the contact portion 34. The metal wiring 36 and the contact portion 34 electrically connect the anode of the first diode D1 (the first semiconductor region 42 and the second semiconductor region 44) and the fuse resistor 22, and function as the connection point 27 illustrated in FIG. 2. The metal wiring 36 may be connected to the high potential wiring VDD via the first resistance element R1.

The other end of the fuse resistor 22 is connected to a metal wiring 37 via the contact portion 34. The metal wiring 37 functions as the connection point 28 which connects the fuse resistor 22 to the pad 24 and the second resistance portion 29. The metal wiring 37 may be electrically connected to the output terminal OUT via the third resistance element R3. In addition, the metal wiring 37 is electrically connected to the ground potential GND via the second resistance portion 29.

An interlayer dielectric film 47 may be formed between the fuse resistor 22, the second semiconductor region 44, and the dielectric film 46, and the metal wirings 36 and 37. That is, the metal wiring 36 and the metal wiring 37 may be formed on the interlayer dielectric film 47. In this case, the contact portion 34 is formed to pass through an opening in the interlayer dielectric film 47.

In the trimming method of this embodiment, the external device 50 may be used. The external device 50 applies the gate voltage Vg, the first potential V1, and the second potential V2 to a gate electrode G of the switching device 3 on the semiconductor substrate 30, the pad 24 on the semiconductor substrate 30, and the first main electrode 220 which is the source electrode of the switching device 3, respectively. Specifically, the external device 50 includes a gate voltage application terminal 54, a first potential application terminal 55, and a second potential application terminal 56. The gate voltage application terminal 54 switches whether to apply the gate voltage Vg to the gate electrode G of the switching device 3 on the semiconductor substrate 30. The first potential application terminal 55 switches whether to apply the first potential V1 to the pad 24 on the semiconductor substrate 30. The second potential application terminal 56 switches whether to apply the second potential V2 to the first main electrode 220 which is the source electrode of the switching device 3.

The external device 50 may be a wafer tester, and may be a tool called a probe card in particular. The probe card is a tool which is used for electrical inspection of the semiconductor device 200 formed on the semiconductor substrate. The probe card functions as a connector which connects an electrode on the semiconductor substrate 30 and the wafer tester which is a measuring machine. A needle of the probe card is in contact with each electrode on the semiconductor substrate 30 to apply the corresponding potential. In a case where a wafer tester is used as the external device 50, the trimming process can be executed without reconnecting another external device depending on the result of the wafer inspection.

Figure 5:
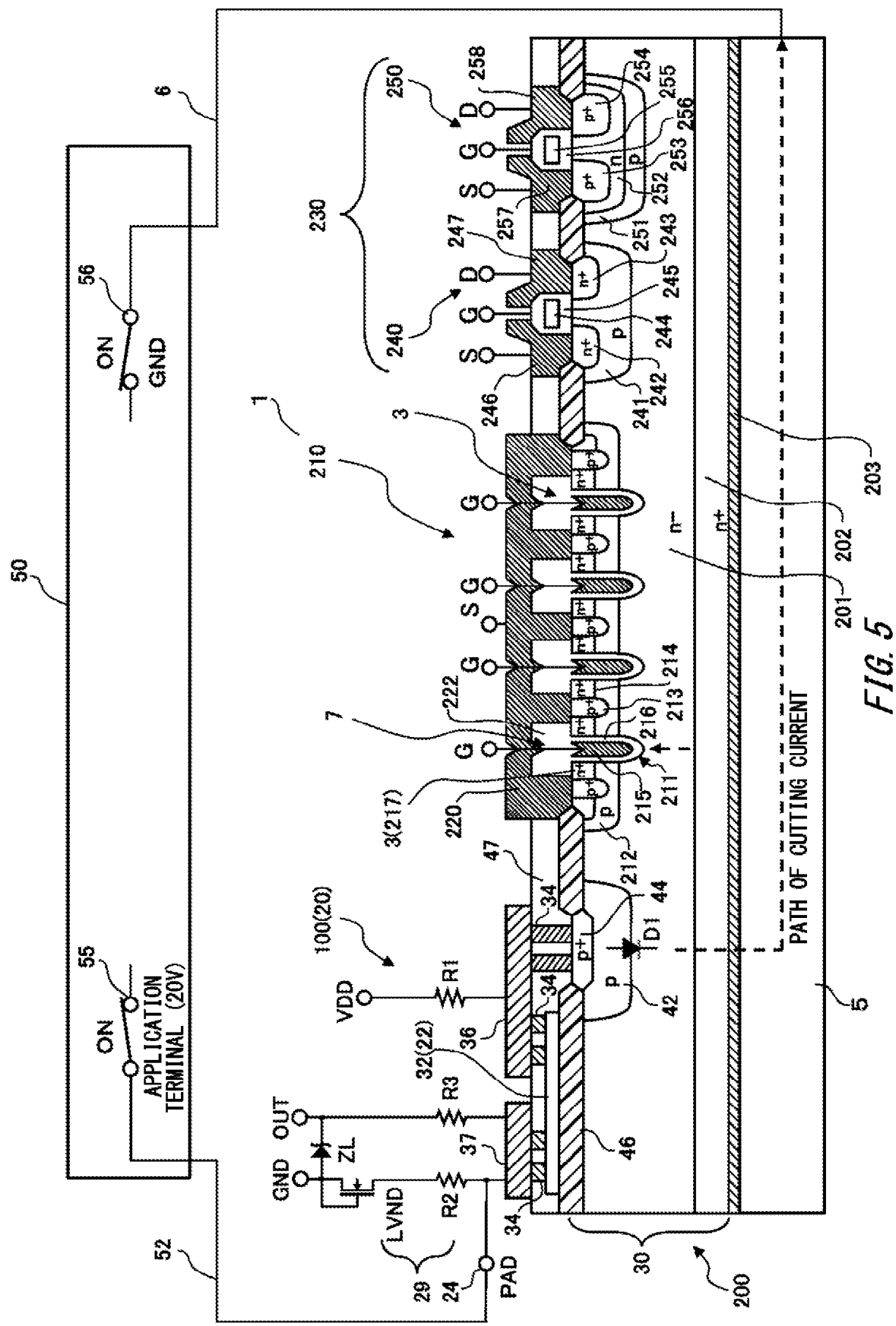
FIG. 5 is a cross-sectional view illustrating an example of the semiconductor device to which the trimming method of the comparative example in FIG. 3 is applied.

FIG. 5 is a cross-sectional view illustrating an example of the semiconductor device 200 to which the trimming method of the comparative example in FIG. 3 is applied. The comparative example illustrated in FIG. 5 is different from the embodiment of the invention illustrated in FIGS. 4A and 4B in the path of the cutting current. The structure itself of the semiconductor device 200 is the same as the structure illustrated in FIG. 4A.

In the comparative example illustrated in FIG. 5, the external device 50 includes the first potential application terminal 55 and the second potential application terminal 56. The first potential application terminal 55 switches whether to apply the first potential V1 to the pad 24 on the semiconductor substrate 30. The second potential application terminal 56 switches whether to apply the second potential V2 to the wafer chuck portion 5 which is arranged in the back surface of the semiconductor substrate 30. In a case where the cutting current flows to the fuse resistor 22 (the polysilicon layer 32) to cut the fuse resistor 22, the first potential application terminal 55 applies the first potential V1 to the pad 24 on the semiconductor substrate 30, and the second potential application terminal 56 applies the second potential V2 (the ground potential in this comparative example) to the wafer chuck portion 5.

In the comparative example, the cutting current flows in the order of the first potential application terminal 55 of the external device 50, the pad 24, the fuse resistor 22 (the polysilicon layer 32), the first diode D1, the contact layer 202, the second main electrode 203, the wafer chuck portion 5, the external cable 6, and the second potential application terminal 56 of the external device 50. Therefore, the rise of the cutting current becomes late due to the influence of impedance of the wafer chuck portion 5 and the external cable 6, for example, the influence of parasitic capacitance.

On the other hand, in one embodiment of the invention illustrated in FIGS. 4A and 4B, in a case where the cutting current flows to the fuse resistor 22 (the polysilicon layer 32) to cut the fuse resistor 22, at least one of the switching devices 3 which are the MOS portion 217 of the longitudinal device 7 provided in the semiconductor substrate 30 is set to the conductible state so as to make the cutting current flow. Therefore, the cutting current flows in the order of the first potential application terminal 55 of the external device 50, the pad 24, the fuse resistor (the polysilicon layer 32), the first diode D1, the channel of the switching device 3, the first main electrode 220, and the second potential application terminal 56 of the external device 50. Therefore, there is no influence of impedance of the wafer chuck portion 5 and the external cable 6, for example, the influence of parasitic capacitance.

Figure 6:
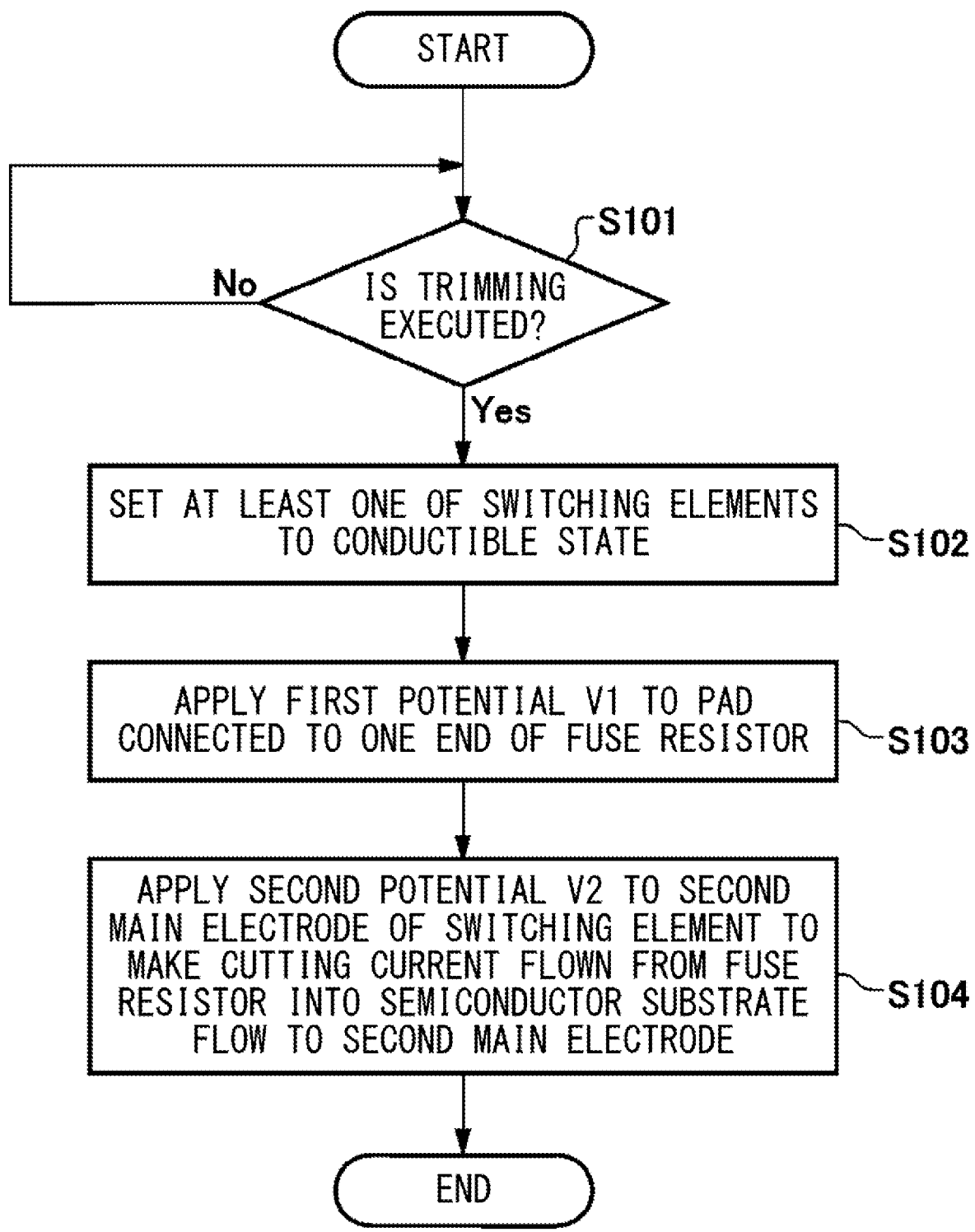
FIG. 6 is an example of a flowchart of the trimming method of an embodiment of the invention.

FIG. 6 is an example of a flowchart of the trimming method of an embodiment of the invention. Whether trimming is executed is determined (Step S101). Whether trimming is executed may be determined based on a result obtained by virtual cutting. For example, the fuse resistor 22 that is selectively cut is determined from among a plurality of fuse resistors 22 so that the resistance value or the current value between a terminal T1 and a terminal T2 falls within a target range.

In a case where trimming is executed (Step S101: YES), that is, in a case where the cutting current flows to the fuse resistor 22 to cut the fuse resistor 22 (Step S101: YES), at least one switching device 3 in the output stage circuit portion 210 is set to the conductible state (Step S102). Specifically, the gate voltage application terminal 54 of the external device 50 adds the gate voltage Vg to the gate electrode G of the switching device 3, so that the switching device 3 which is the MOS portion 217 of the longitudinal device 7 is set to the conductible state. The wafer chuck portion 5 is floated. According to the arrangement position of the fuse resistor 22 to be trimmed, one or more switching devices 3, which are within a predetermined distance from the fuse resistor 22, may be selected from among the plurality of switching devices 3 so as to be set to the conductible state.

Then, a voltage between the pad 24 connected to one end of the fuse resistor 22 and the first main electrode 220 of the switching device 3 is adjusted to make the forward current flow to the first diode D1. In this example, the first potential V1 higher than the third potential V3 of the high potential wiring VDD is applied to the pad 24 connected to one end of the fuse resistor 22 (Step S103). On the other hand, the second potential V2 is applied to the first main electrode 220 of the switching device 3 (Step S104). As a result, the cutting current flowing from the fuse resistor 22 into the semiconductor substrate 30 flows to the first main electrode 220 (Step S104).

In an example, the first potential application terminal 55 of the external device 50 is switched to a state in which the first potential V1 is applied to the pad 24 on the semiconductor substrate 30. The second potential application terminal 56 of the external device 50 is switched to a state in which the second potential V2 is applied to the first main electrode 220 which is the source electrode of the switching device 3. Further, Step S102, Step S103, and Step S104 may be executed at the same time.

In this embodiment, the cutting current does not go through the wafer chuck portion 5 and the external cable 6. Therefore, according to the trimming method of this embodiment, it is possible to suppress that the rise of the cutting current becomes late due to the influence of impedance of the wafer chuck portion 5 and the external cable 6, for example, the influence of parasitic capacitance. In addition, the rise of the current at the time of cutting the fuse resistor 22 can be made early without being affected by the specifications of the wafer chuck portion 5 and the specifications of the external cable 6. Therefore, the fuse resistor 22 can be stably cut. Since the wafer tester or the like can also be used as the external device 50, remodeling of the external device 50 is not required.

According to this embodiment, the fuse resistor 22 (the polysilicon layer 32) is provided in the upper surface of the semiconductor substrate 30 via the dielectric film 46. Then, in a case where the cutting current flows, the switching device 3 provided on the upper surface side of the semiconductor substrate 30 is set to the conductible state. Therefore, the cutting current flows between portions provided in the upper surface of the semiconductor substrate 30, so that the flowing path of the cutting current can be shortened.

In addition, according to this embodiment, the switching device 3 which is the MOS portion 217 of the longitudinal device 7 is set to the conductible state and the cutting current flows, so that a large current sufficient to cut the fuse resistor 22 can flow. In a case where the cutting current flows, the MOS portions 217 of the plurality of power semiconductor devices arranged around the fuse resistor to be trimmed may be set to the conductible state. Thereby, a large cutting current can flow compared to a case where the cutting current flows through one switching device 3.

In particular, the switching device 3 functioning as the MOS portion 217 of the longitudinal device 7 during operation is used as a lateral IGBT or the like during trimming, so that the operating resistance during trimming can be lowered.

According to this embodiment, in a case where the cutting current flows, the existing switching device 3 can be used, and there is no need to provide another switching device 3, so that the trimming circuit can be miniaturized. In particular, the switching device 3 included in the adjustment circuit 1 can be utilized.

Further, as in the case of the comparative example, according to the trimming circuit 100 of this embodiment, a virtual cutting that confirms the electrical characteristics of an adjustment element after the fuse resistor 22 is cut can be realized before the fuse resistor 22 is cut.

Also in this example, the pad 24 for trimming connected to one end of the fuse resistor 22 is required, but the first main electrode 220 of the switching device 3 can be used as the terminal on the other end side of the fuse resistor 22, and there is no need to provide an external terminal dedicated to trimming. In addition, it is not necessary to provide a resistance bypass circuit which can withstand a large current that melts the fuse resistor 22. Therefore, the trimming circuit 100 which achieves both miniaturization and virtual cutting function can be realized compared to the related art.

According to the trimming circuit 100 of this example, the pad 24 and the output terminal OUT are electrically connected via the metal wiring 37 and the third resistance element R3 even if the fuse resistor 22 is cut. Therefore, the pad 24 for trimming can be utilized again for monitoring the voltage at the output terminal OUT. Specifically, the voltage So at the output terminal OUT can be measured even after trimming. In addition, it is possible to confirm the presence or absence of deterioration (leakage) that trimming causes in the element, and high reliability in the circuit can be secured.

Figure 7:
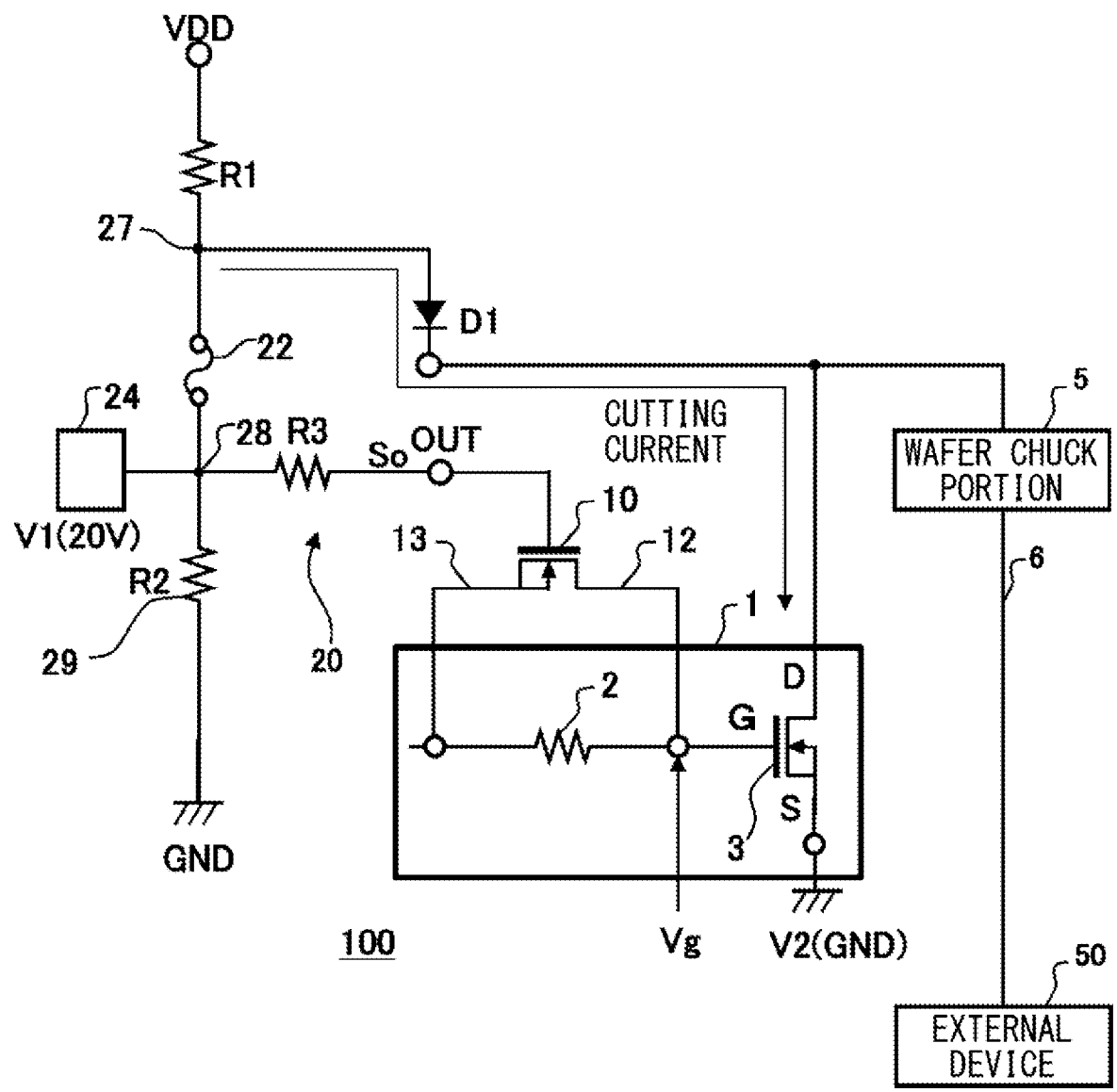
FIG. 7 is another circuit diagram to which the trimming method is applied.

FIG. 7 is another circuit diagram to which the trimming method is applied. In the trimming circuit 100 illustrated in FIG. 7, the protection diode ZL is omitted. In addition, the second resistance portion 29 in FIG. 7 is configured by the second resistance element R2, and the resistance element LVND is omitted. Also in the example illustrated in FIG. 7, the trimming method of the invention can be executed.

Figure 8:
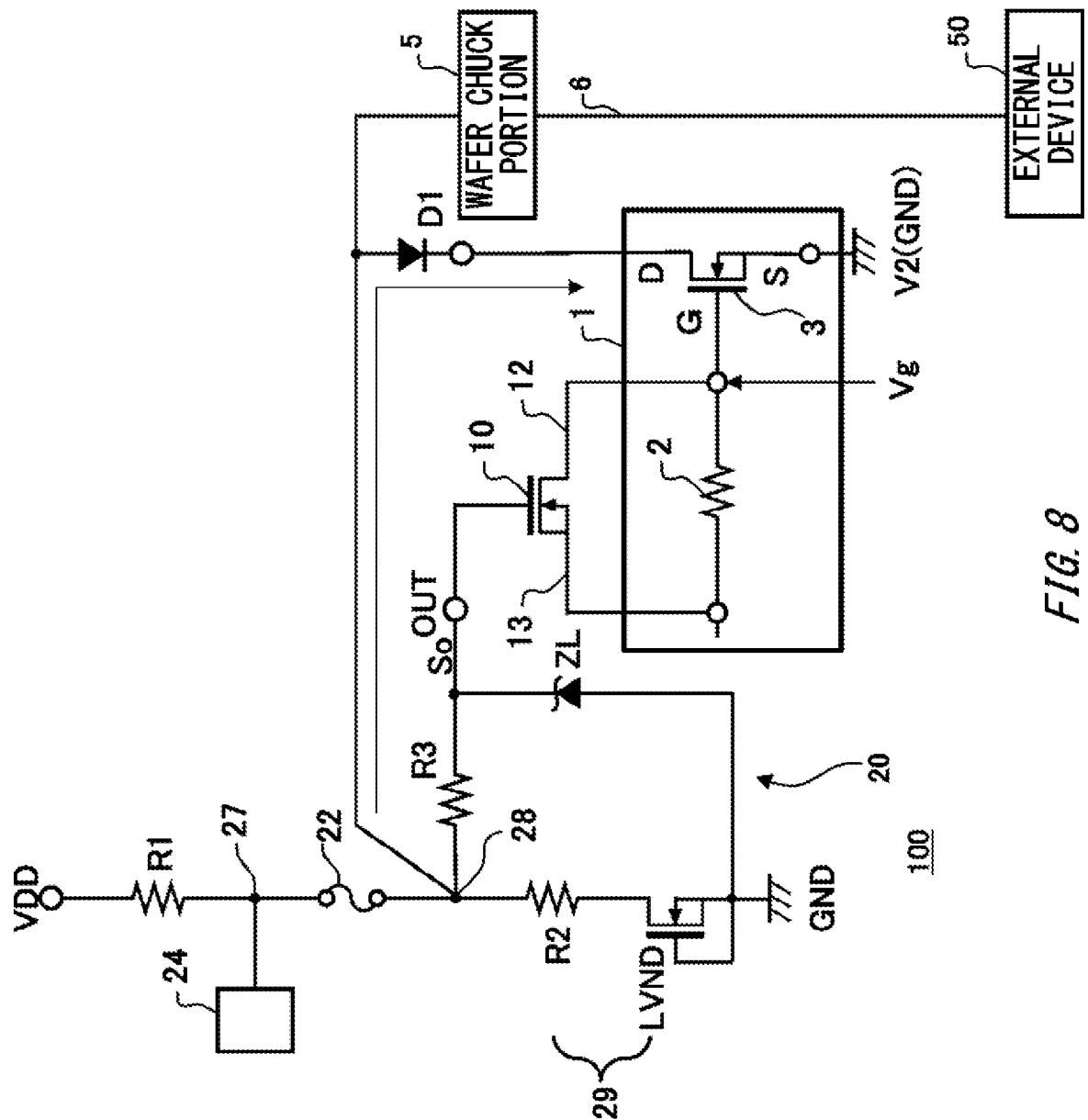
FIG. 8 is another circuit diagram to which the trimming method is applied.

FIG. 8 is another circuit diagram to which the trimming method is applied. In the trimming circuit illustrated in FIG. 8, the pad 24 for trimming is connected to the connection point 27 between the fuse resistor 22 and the first resistance element R1, and the first diode D1 is connected to the connection point 28 between the fuse resistor 22 and the second resistance portion 29. The output terminal OUT is connected to the connection point 28 between the first diode D1 and the fuse resistor 22 via the third resistance element R3.

Also in the trimming circuit illustrated in FIG. 8, the pad 24 for trimming is not provided at both ends of the fuse resistor 22, so that the circuit area can be prevented from expanding. However, in the trimming circuit illustrated in FIG. 8, the pad 24 and the output terminal OUT are electrically separated in a state where the fuse resistor 22 is cut. Therefore, the pad 24 for trimming cannot be utilized again for monitoring the voltage at the output terminal OUT.

Also in the trimming circuit 100 illustrated in FIG. 8, in a case where the cutting current flows to the fuse resistor 22 to cut the fuse resistor 22, at least one switching device 3 provided in the semiconductor substrate 30 is set to the conductible state so that the cutting current can flow to the switching device 3. Therefore, it is possible to prevent that the rise of the cutting current at the time of cutting the fuse resistor 22 becomes late due to the influence of impedance of the wafer chuck portion 5 and the external cable 6, for example, the influence of parasitic capacitance.

Figure 9:
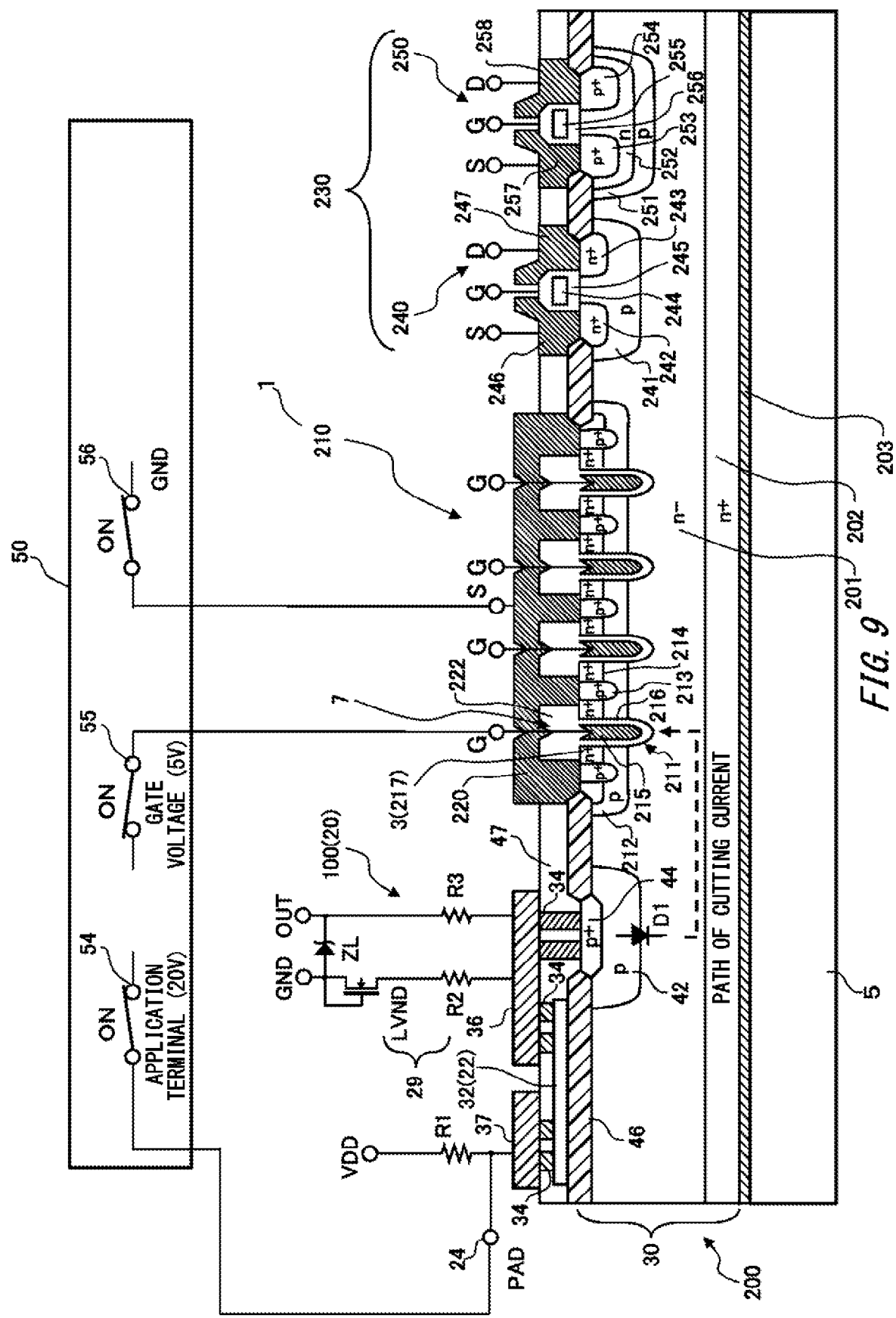
FIG. 9 is an example of the semiconductor device to which the trimming method in FIG. 8 is applied.

FIG. 9 is a cross-sectional view illustrating an example of the semiconductor device to which the trimming method in FIG. 8 is applied. The metal wiring 36 and the contact portion 34 are electrically connected to the anode of the first diode D1 and the fuse resistor 22, and function as the connection point 28 illustrated in FIG. 8. In addition, the metal wiring 36 connects the fuse resistor 22 and the second resistance portion 29. In addition, the metal wiring 36 may be electrically connected to the output terminal OUT via the third resistance element R3. In addition, the metal wiring 36 may be electrically connected to the ground potential GND via the second resistance portion 29. On the other hand, the metal wiring 37 connects the fuse resistor 22 to the first resistance element R1. The metal wiring 37 may be connected to the high potential wiring VDD via the first resistance element R1.

Except for the above points, the configuration of the semiconductor device 200 illustrated in FIG. 9 is the same as the configuration of the semiconductor device illustrated in FIGS. 4A and 4B. Therefore, the description of the repetition is omitted. Also in the semiconductor device 200 illustrated in FIG. 9, the external device 50 may be used. The external device 50 applies the gate voltage, the first potential, and the second potential to a gate electrode G of the switching device 3 on the semiconductor substrate 30, the pad 24 on the semiconductor substrate 30, and the first main electrode 220 which is the source electrode of the switching device 3, respectively.

Also in the embodiment illustrated in FIG. 9, the same trimming method as that illustrated in FIGS. 4A and 4B can be applied. Since the cutting current does not go through the wafer chuck portion 5 and the external cable 6, it is possible to suppress that the rise of the cutting current becomes late due to the influence of impedance of the wafer chuck portion 5 and the external cable 6, for example, the influence of parasitic capacitance. In addition, the path through which the cutting current flows can be shortened.

Figure 10:
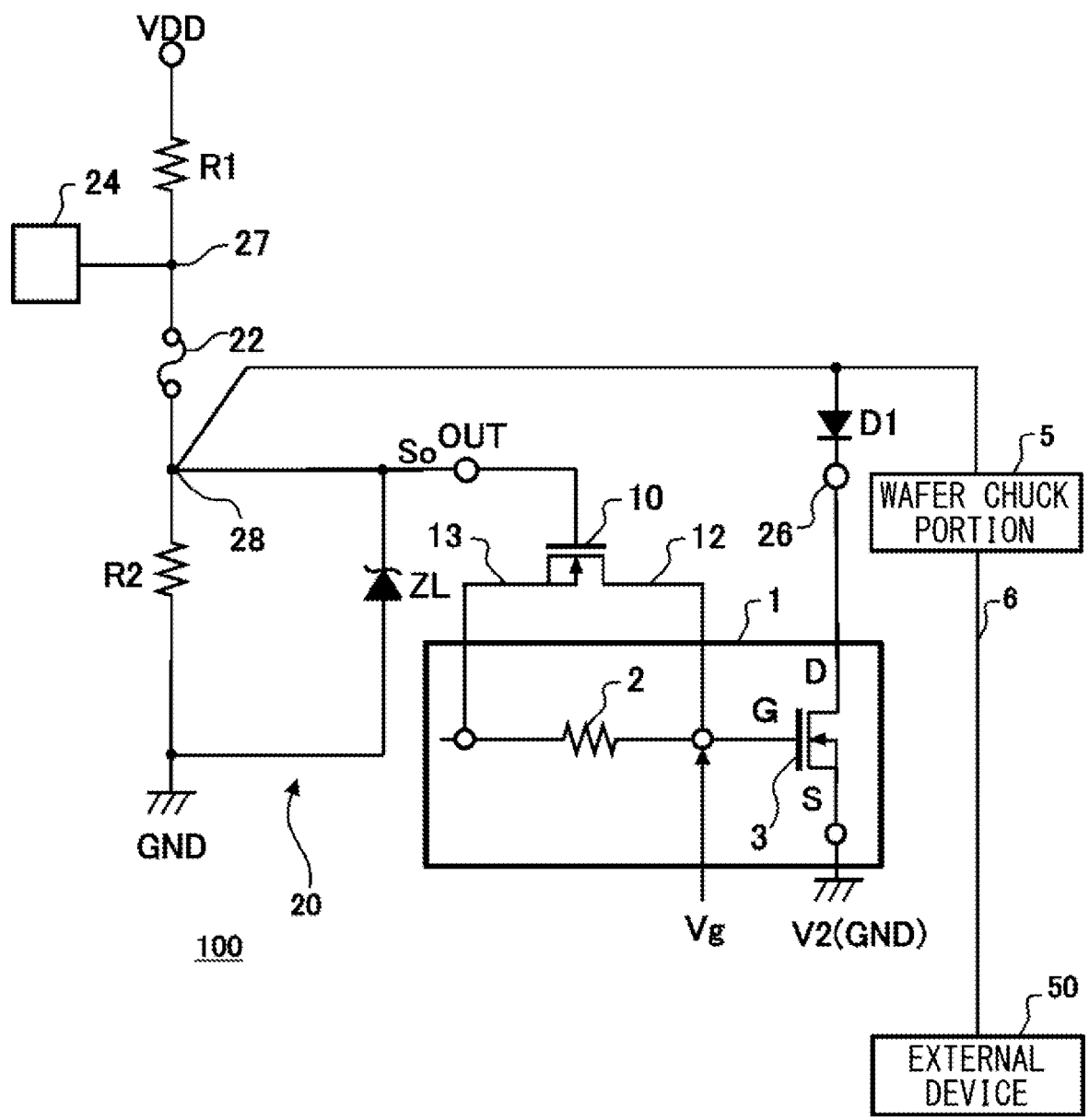
FIG. 10 is a circuit diagram illustrating another application example of the trimming method.

FIG. 10 is a circuit diagram illustrating another application example of the trimming method. In the trimming circuit 100 illustrated in FIG. 10, the third resistance element R3 in the trimming circuit 100 illustrated in FIG. 8 is omitted. Further, the second resistance portion 29 in FIG. 10 is configured by the second resistance element R2, and the resistance element LVND is omitted. Also in the example illustrated in FIG. 10, the trimming method of the invention can be executed.

FIGS. 2, 7, and 8 described above and the trimming circuit 100 illustrated in FIG. 10 show a case in which the switching device 3 included in the adjustment circuit 1 is set to the conductible state so that the cutting current flows to the switching device 3 when the cutting current flows to the fuse resistor 22 to cut the fuse resistor 22. A separate switching device other than the adjustment circuit 1 may not be provided by utilizing the switching device 3 included in the adjustment circuit 1 in a case where the cutting current flows, and the trimming circuit can be miniaturized. However, the invention is not limited to the case.

Figure 11:
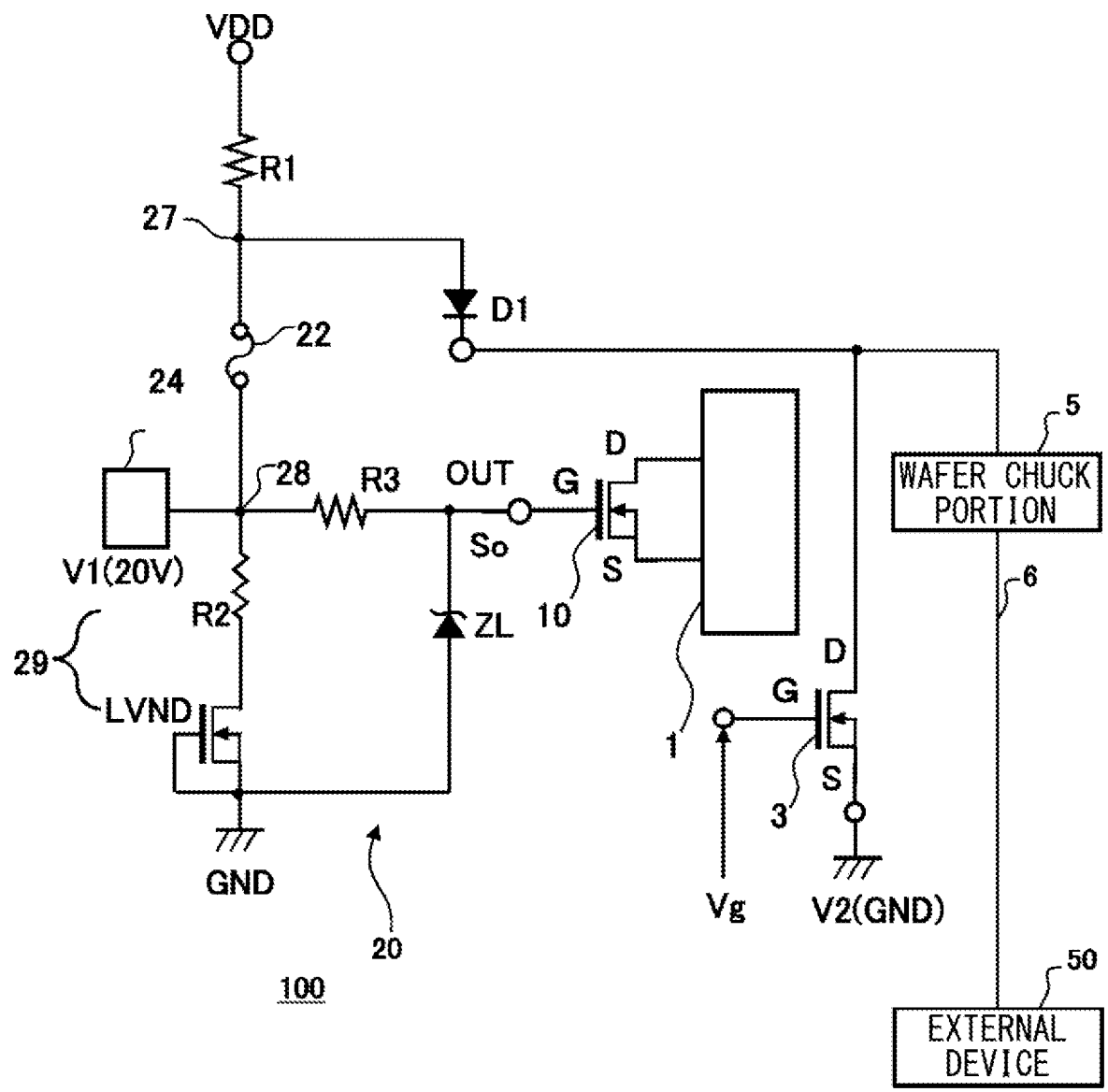
FIG. 11 is a circuit diagram illustrating another application example of the trimming method.

FIG. 11 is a circuit diagram illustrating another application example of the trimming method. In this example, the switching device 3 is provided as an element different from the element included in the adjustment circuit 1. The switching device 3 may be provided in the semiconductor substrate 30 illustrated in FIG. 4A or 9. The switching device 3 may be one or more. In a case where the cutting current flows to the fuse resistor 22 to cut the fuse resistor 22, the switching device 3 is set to the conductible state to make the cutting current flow to the switching device 3.

Specifically, in a case where the cutting current flows to the fuse resistor 22 to cut the fuse resistor 22, the gate voltage Vg is applied to the gate electrode G of the switching device 3. As a result, the switching device 3 becomes the conductible state. The switching device 3 illustrated in FIG. 11 only needs to be an element different from the adjustment circuit 1, and a switching device provided for other use may be also used as the switching device 3.

Also in the embodiment illustrated in FIG. 11, the cutting current does not go through the wafer chuck portion 5 and the external cable 6. Therefore, also according to the trimming method of this embodiment, it is possible to suppress that the rise of the cutting current becomes late due to the influence of impedance of the wafer chuck portion 5 and the external cable 6, for example, the influence of parasitic capacitance. In addition, the path through which the cutting current flows can be shortened.

Figure 12:
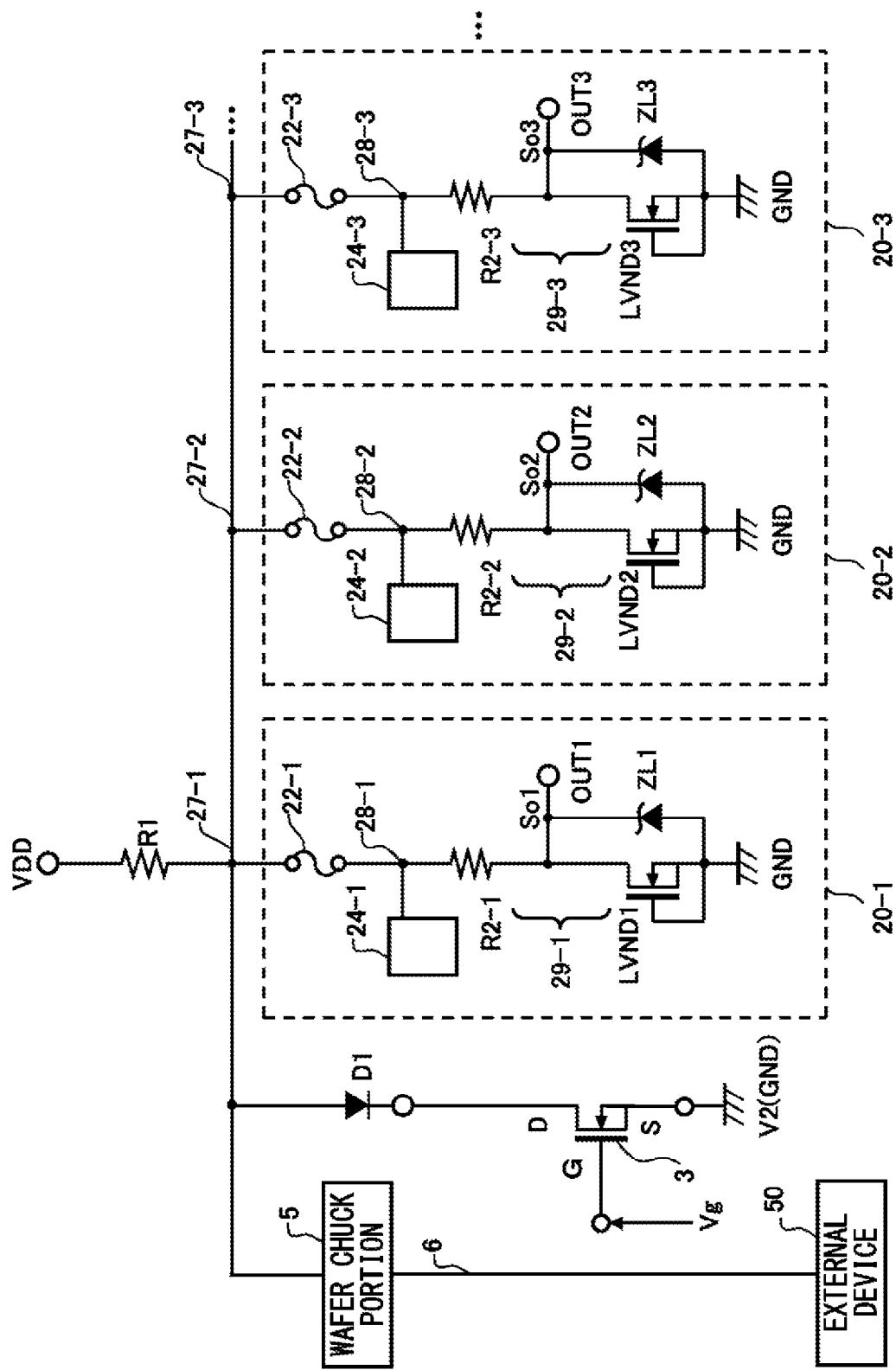
FIG. 12 is another circuit diagram to which the trimming method is applied.

FIG. 12 is another circuit diagram to which the trimming method is applied. The trimming circuit 100 of this example includes a plurality of main body portions 20. The trimming circuit 100 of this example includes the main body portions 20-1, 20-2, 20-3, and so on. In this specification, the k-th main body portion 20 may be called the main body portion 20-$k$. In addition, in each diagram, a branch number of k is attached to the sign of each component in the main body portion 20-$k$. Each main body portion 20 is provided in correspondence with the adjustment element 2. Each main body portion 20 may be connected to the gate of the transistor portion 10 illustrated in FIG. 1.

Each main body portion 20 has the same structure as the main body portion 20 of any embodiment described in FIGS. 1 to 11. In FIG. 12, each main body portion 20 has the same structure as the main body portion 20 illustrated in FIG. 2. However, in FIG. 12, the third resistance element R3 is omitted.

The main body portion 20 in each embodiment may include the third resistance element R3 or not. In addition, in FIG. 12, the second resistance element R2 is arranged between the pad 24 and the output terminal OUT. In the main body portion 20 of each embodiment, the second resistance element R2 may be arranged between the pad 24 and the output terminal OUT as in FIG. 12, or may be arranged between the pad 24 and the resistance element LVND as in FIG. 2.

In the trimming circuit 100 of this example, the first diode D1 and the switching device 3 are commonly provided with respect to the plurality of main body portions 20. That is, in each main body portion 20, an individual first diode D1 and an individual switching device 3 are not provided. The common first diode D1 is connected to the fuse resistor 22 of each main body portion 20. The anode of the first diode D1 of this example is connected to the plurality of fuse resistors 22. Then, the cathode side of the first diode D1 is connected to the drain side of the switching device 3.

Each fuse resistor 22-$k$ may be arranged in the upper surface of the semiconductor substrate 30 via the dielectric film 46 as illustrated in FIG. 4A or 9, and the switching device 3 may be provided in the upper surface of the semiconductor substrate 30. The switching device 3 may be a longitudinal device which controls whether to make the current flow between the first main electrode 220 provided in the upper surface of the semiconductor substrate 30 and the second main electrode 203 provided in the lower surface of the semiconductor substrate 30.

In a case where the cutting current flows, the switching device 3 is set to the conductible state, and the cutting current flown from the fuse resistor 22-$k$ into the semiconductor substrate 30 may flow to the first main electrode 220. The switching device 3 may be the switching device 3 which is included in any of the adjustment circuit 1-$k$ adjusted by any of the plurality of main body portions 20-$k$.

One end of the fuse resistor 22-$k$ of this example is connected to the pad 24-$k$, and the other end is connected to the first diode D1. In this example, the one end of the fuse resistor 22-$k$ is connected to the output terminal OUTk and the resistance element LVNDk via the second resistance element R2-1.

In addition, the other end of the fuse resistor 22-$k$ is connected to the first resistance element R1. In this example, the first resistance element R1 is commonly provided with respect to the plurality of main body portions 20. One end of the first resistance element R1 is connected to the first diode D1, and the other end is connected to the high potential wiring VDD. In this example, the connection point 27-$k$ is provided with respect to each main body portion 20-$k$. The anode of the first diode D1, one end of the first resistance element R1, and the other of the fuse resistor 22 are connected to the connection point 27-$k$.

The device scale can be reduced by commonly providing the first diode D1 and the switching device 3 with respect to the plurality of main body portions 20. In addition, the device scale can be reduced by commonly providing the first resistance element R1 with respect to the plurality of main body portions 20.

In this example, in a case where the cutting current flows to the fuse resistor 22-$k$ to cut the fuse resistor 22-$k$, one or at least one of the plurality of switching devices 3 which are commonly provided with respect to the plurality of main body portions 20 is set to the conductible state to make the cutting current flow to the switching device 3.

The fuse resistors 22 to be cut are selected one by one, and a predetermined high potential is applied sequentially to the pad 24 corresponding to the fuse resistor 22-$k$ to be cut. The cutting operation of the fuse resistor 22 in each main body portion 20 is the same as the example of FIG. 6. As described above, the high potential is a first potential which is higher than the voltage applied to the high potential wiring VDD. The unselected pad 24 is set to float.

In addition, the ground potential to be applied to the main body portion 20 selected to cut the fuse resistor 22 may be changed. For example, in a case where the fuse resistor 22-$k$ is cut, the ground potential to be applied to the main body portion 20-$k$ is increased. The ground potential of the main body portion 20-$k$ may be controlled to be the same potential as the potential to be applied to the pad 24-$k$. Thereby, it is possible to suppress the current flowing from the pad 24-$k$ to the second resistance portion 29-$k$.

In addition, in a case where virtual cutting is set, a voltage for virtual cutting may be applied to each pad 24 in parallel. That is, each main body portion 20 can be set to a virtual cutting state in parallel. In addition, some main body portions 20 may be selectively set to the virtual cutting state.

In addition, the resistance values of the first resistance element R1 and the second resistance element R2 may be sufficiently smaller than the resistance value of the resistance element LVND. By increasing the resistance value of the resistance element LVND, the current flowing to the main body portion 20 can be narrowed down.

Also in this example, the cutting current does not go through the wafer chuck portion 5 and the external cable 6. Therefore, also according to the trimming method of this embodiment, it is possible to suppress that the rise of the cutting current becomes late due to the influence of impedance of the wafer chuck portion 5 and the external cable 6, for example, the influence of parasitic capacitance. In addition, the path through which the cutting current flows can be shortened.

Figure 13:
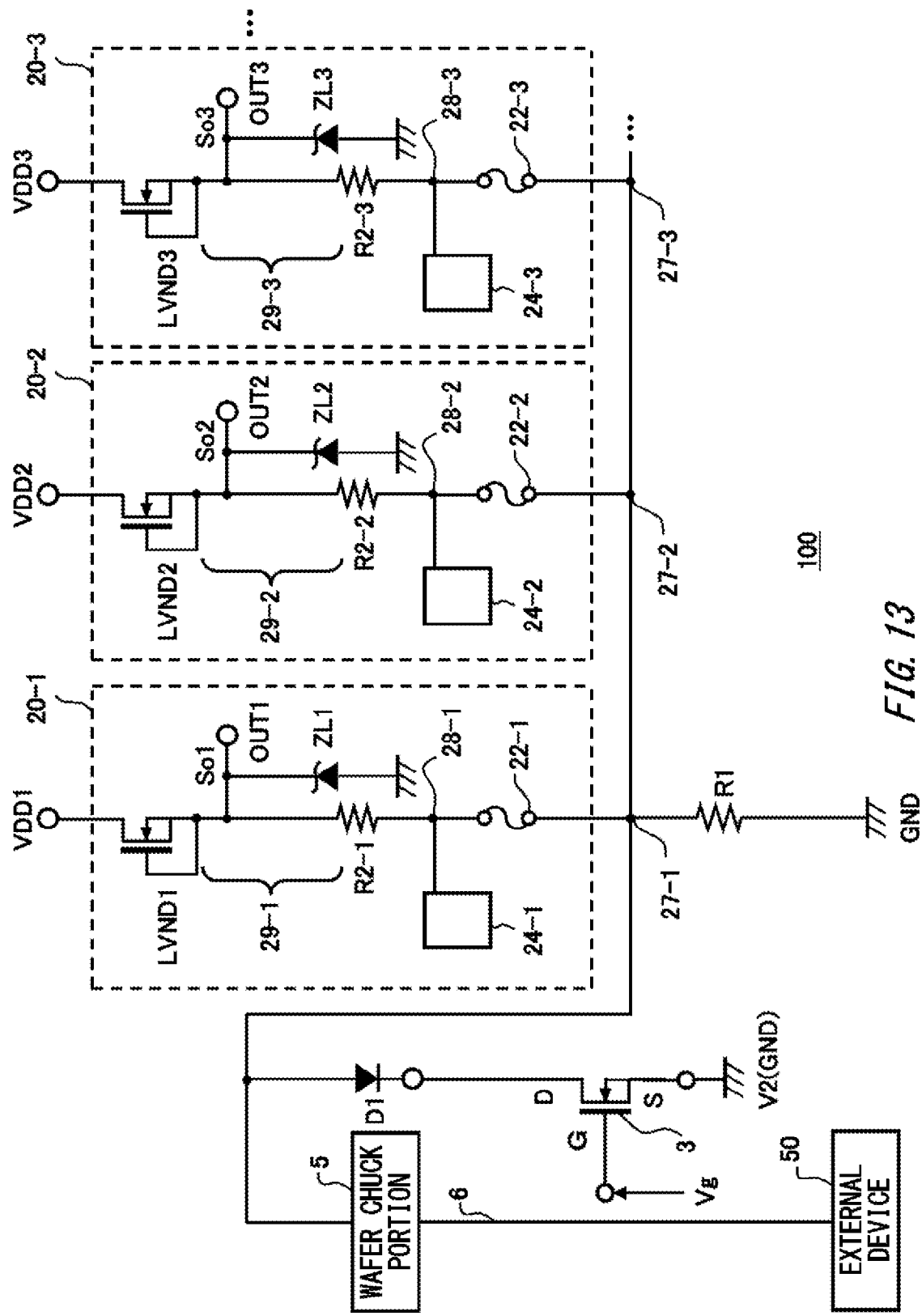
FIG. 13 is another circuit diagram to which the trimming method is applied.

FIG. 13 is another circuit diagram to which the trimming method is applied. The trimming circuit 100 of this example includes the plurality of main body portions 20. Also in this example, as in the example of FIG. 12, the first diode D1 and the first resistance element R1 are commonly provided with respect to the plurality of main body portions 20. However, the first diode D1 of this example is connected to the connection point 27-$k$ between each fuse resistor 22-$k$ and the ground potential. In addition, the first resistance element R1 is connected between each connection point 27 and the ground potential.

The main body portion 20 of this example outputs the voltage corresponding to the high potential VDD from the output terminal OUT in a state where the fuse resistor 22 is cut. In addition, the main body portion 20 of this example outputs the voltage corresponding to the ground potential from the output terminal OUT in a state where the fuse resistor 22 is not cut.

In each main body portion 20, the fuse resistor 22 is connected to the first diode D1 and the first resistance element R1. One end of each fuse resistor 22-$k$ is connected to the pad 24-$k$, and the other end is connected to the first diode D1 and the first resistance element R1. The second resistance element R2-$k$ is connected to the connection point 28-$k$ between the pad 24-$k$ and the fuse resistor 22-$k$. One end of the second resistance element R2-$k$ is connected to the connection point 28-$k$, and the other end is connected to the resistance element LVNDk.

One end of the resistance element LVNDk is connected to the second resistance element R2-$k$, and the other end is connected to the high potential wiring VDD. In this example, the connection point between the resistance element LVNDk and the second resistance element R2-$k$ is connected to the output terminal OUTk. The protection diode ZL may be provided between the output terminal OUTk and the ground potential.

Also in this example, the device scale can be small by commonly providing the first diode D1 with respect to the plurality of main body portions 20. In addition, the device scale can be reduced by commonly providing the first resistance element R1 with respect to the plurality of main body portions 20.

In this example, in a case where the cutting current flows to the fuse resistor 22-$k$ to cut the fuse resistor 22-$k$, one or at least one of the plurality of switching devices 3 which are commonly provided with respect to the plurality of main body portions 20 is set to the conductible state to make the cutting current flow to the switching device 3.

In this example, the fuse resistors 22 to be cut are selected one by one, and a predetermined high potential is applied sequentially to the pad 24 corresponding to the fuse resistor 22-$k$ to be cut. As described above, the high potential may be the first potential which is higher than the voltage applied to the high potential wiring VDD. The unselected pad 24 is set to float.

Figure 14:
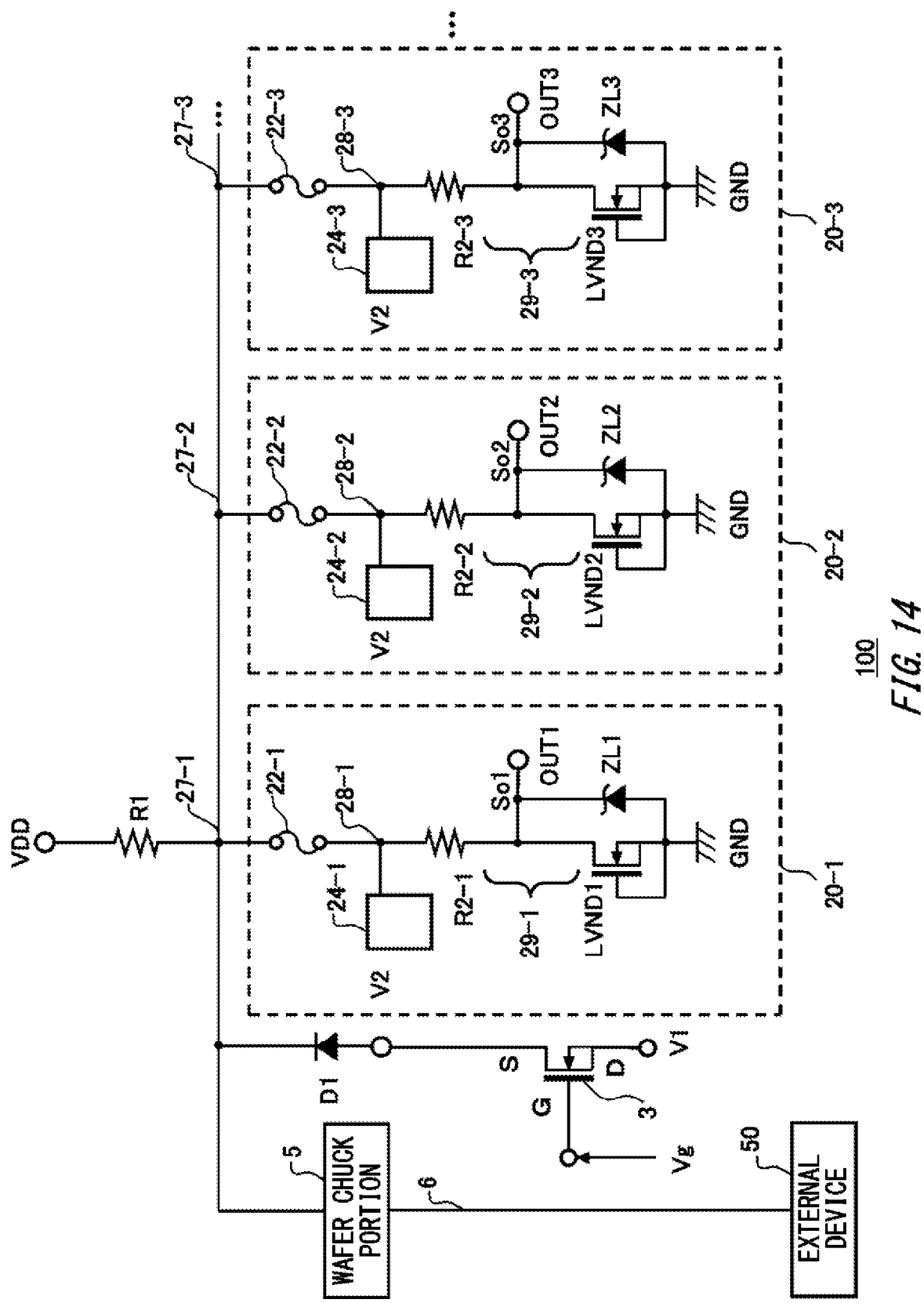
FIG. 14 is another circuit diagram to which the trimming method is applied.

FIG. 14 is another circuit diagram to which the trimming method is applied. The trimming circuit 100 of this example is different from the example of FIG. 12 in the directions of the anode and cathode of the first diode D1. In addition, the trimming circuit 100 of this example is different from the example of FIG. 12 in the directions of the drain and source of the switching device 3. In this example, the first potential is applied to the switching device 3 instead of the second potential V2. The second potential V2 is selectively applied to the pad 24 of the main body portion 20-$k$ of which the fuse resistor 22-$k$ is cut. Except for these points, the configuration example of FIG. 14 is the same as the exemplary configuration illustrated in FIG. 12. Therefore, a detailed explanation is omitted.

The fuse resistor 22 of each main body portion 20 is connected to the cathode of the first diode D1 of this example. One end of each fuse resistor 22-$k$ is connected to the pad 24-$k$, and the other end is connected to the cathode of the first diode D1 via the the connection point 27-$k$.

In this example, the second potential V2 is selectively applied to the pad 24-$k$ of the main body portion 20-$k$ of which the fuse resistor 22-$k$ is cut. The second potential V2 is a voltage so low that the forward current flows from the first diode D1 to the pad 24-$k$. That is, the second potential V2 is lower than the sum or more of the voltage drop due to the operating resistance of the switching device 3 functioning as a lateral IGBT and the forward voltage of the first diode D1 with respect to the first potential V1 to be applied to the drain electrode of the switching device 3. For example, the second potential is a potential lower than the ground potential.

Figure 15:
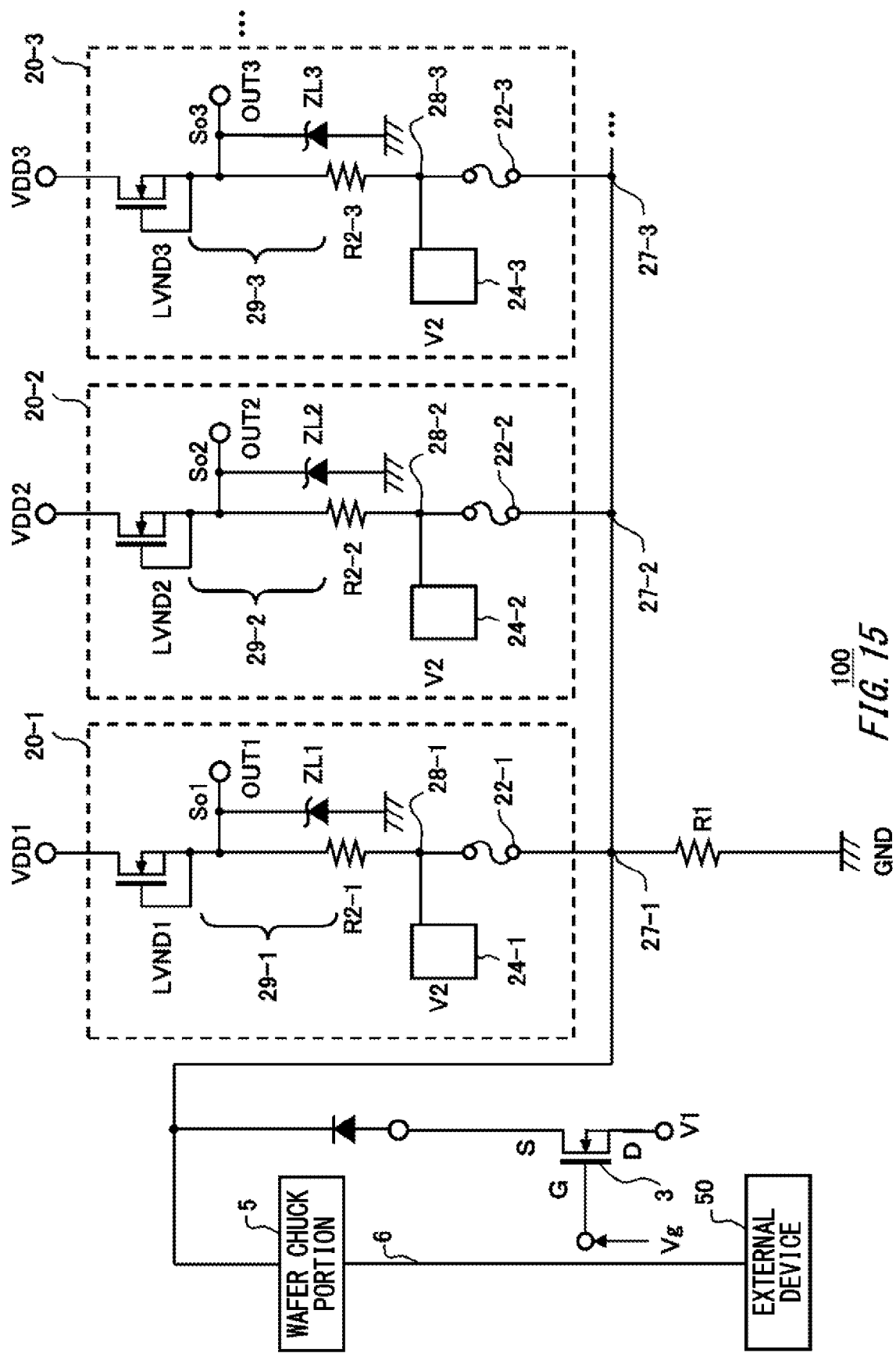
FIG. 15 is another circuit diagram to which the trimming method is applied.

FIG. 15 is another circuit diagram to which the trimming method is applied. The trimming circuit 100 of this example is different from the example of FIG. 13 in the directions of the anode and cathode of the first diode D1. In addition, the trimming circuit 100 of this example is different from the example of FIG. 13 in the directions of the drain and source of the switching device 3. In this example, the first potential V1 is applied to the switching device 3 instead of the second potential V2. The second potential V2 is selectively applied to the pad 24 of the main body portion 20-$k$ of which the fuse resistor 22-$k$ is cut. Except for these points, the configuration example of FIG. 15 is the same as the exemplary configuration illustrated in FIG. 13. Therefore, a detailed explanation is omitted.

One end of each fuse resistor 22-$k$ is connected to the pad 24-$k$, and the other end is connected to the first diode D1 via the connection point 27-$k$. In this example, the second potential V2 is selectively applied to the pad 24-$k$ of the main body portion 20-$k$ of which the fuse resistor 22-$k$ is cut. The second potential V2 is a voltage so low that the forward current flows from the first diode D1 to the pad 24-$k$. That is, the second potential V2 is lower than the sum or more of the voltage drop due to the operating resistance of the switching device 3 functioning as a lateral IGBT and the forward voltage of the first diode D1 with respect to the first potential V1 to be applied to the drain electrode of the switching device 3. For example, the second potential is a potential lower than the ground potential.

The components attached with the same symbol described in embodiments may have the same characteristics, functions, and structures. Further, the symbol containing the branch number k and the symbol not containing the branch number k are the same symbol if the symbols except the branch number are the same.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages and the like of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or the operation flows in diagrams, it does not necessarily mean that the process must be performed in this order.

EXPLANATION OF REFERENCES

1: adjustment circuit
2: adjustment element
3: switching device
5: wafer chuck portion
6: external cable
7: longitudinal device
10: transistor portion
11: gate
12: drain
13: source
20: main body portion
22: fuse resistor
24: pad
27: connection point
28: connection point
29: second resistance portion
30: semiconductor substrate
32: polysilicon layer
34: contact portion
36: metal wiring
37: metal wiring
42: first semiconductor region
44: second semiconductor region
46: dielectric film
47: interlayer dielectric film
50: external device
54: gate voltage application terminal
55: first potential application terminal
56: second potential application terminal
100: trimming circuit
200: semiconductor device
201: drift layer
202: contact layer
203: second main electrode
210: output stage circuit portion
211: trench gate
212: p type base region
213: p+ type region
214: n+ type region
215: conductive portion
216: dielectric film
217: MOS portion
218: lateral IGBT
220: first main electrode
222: dielectric film
230: control circuit portion
240: MOS transistor
241: p well region
242: source region
243: drain region
244: gate electrode
245: gate dielectric film
246: source electrode
247: drain electrode
250: MOS transistor
251: p well region
252: n well region
253: source region
254: drain region
255: gate electrode
256: gate dielectric film
257: source electrode
258: drain electrode

What is claimed is:

1. A trimming method for adjusting electrical characteristics of an adjustment circuit, which is provided in a semiconductor substrate, by cutting a fuse resistor provided in the semiconductor substrate, the trimming method comprising:

setting, in a case where a cutting current flows to the fuse resistor to cut the fuse resistor, at least one switching device of switching devices provided in the semiconductor substrate to a conductible state to make the cutting current flow to the at least one switching device, wherein the fuse resistor is arranged in one surface of the semiconductor substrate via a dielectric film, a conductivity type of the semiconductor substrate is an n type, each of the switching devices includes:
a p type base region which is formed on one surface side of the semiconductor substrate;
an n type region which is formed in the base region;
a conductive portion which is formed on the base region between the semiconductor substrate and the n type region via a dielectric film; and
a first main electrode which is in contact with the n type region, and
a p type region is provided which is formed separately from the p type base region on the one surface side of the semiconductor substrate, and electrically connected to the fuse resistor, the trimming method further comprising:
flowing the cutting current to a lateral IGBT which includes the p type region, the semiconductor substrate, the p type base region, and the n type region as components.

2. The trimming method according to claim 1,
wherein the at least one switching device is a part of a longitudinal device which controls whether to making a current flow between a first main electrode provided on the one surface of the semiconductor substrate and a second main electrode provided on another surface of the semiconductor substrate, and
in a case where the cutting current flows, the cutting current which flows into the semiconductor substrate via the fuse resistor flows to the first main electrode.

3. A trimming method for adjusting electrical characteristics of an adjustment circuit, which is provided in a semiconductor substrate, by cutting a fuse resistor provided in the semiconductor substrate, the trimming method comprising:

setting, in a case where a cutting current flows to the fuse resistor to cut the fuse resistor, at least one switching device of switching devices provided in the semiconductor substrate to a conductible state to make the cutting current flow to the at least one switching device, wherein the fuse resistor is arranged in one surface of the semiconductor substrate via a dielectric film, the switching device is a part of the IGBT which controls whether to make a current flow between a first main electrode provided on the one surface of the semiconductor substrate and a second main electrode provided on another surface of the semiconductor substrate, and in a case where the cutting current flows, the cutting current which flows into the semiconductor substrate via the fuse resistor flows to the first main electrode,
wherein the switching device includes:
a p type base region which is formed on one surface side of the semiconductor substrate;
an n type region which is formed in the base region;
a conductive portion which is formed on the base region between the semiconductor substrate and the n type region via a dielectric film; and
a first main electrode which is in contact with the n type region.

4. The trimming method according to claim 3, wherein:
a p type region is formed on the one surface side of the semiconductor substrate separately from the p type base region, and is electrically connected to the fuse resistor, the trimming method further comprising:
flowing the cutting current to a lateral IGBT which includes the p type region, the semiconductor substrate, the p type base region, and the n type region as components.

5. A trimming method for adjusting electrical characteristics of an adjustment circuit, which is provided in a semiconductor substrate, by cutting a fuse resistor provided in the semiconductor substrate, the trimming method comprising:
setting, in a case where a cutting current flows to the fuse resistor to cut the fuse resistor, at least one switching device of switching devices provided in the semiconductor substrate to a conductible state to make the cutting current flow to the at least one switching device, wherein
the fuse resistor is arranged in one surface of the semiconductor substrate via a dielectric film,
the switching device is a part of the IGBT which controls whether to make a current flow between a first main electrode provided on the one surface of the semiconductor substrate and a second main electrode provided on another surface of the semiconductor substrate,
in a case where the cutting current flows, the cutting current which flows into the semiconductor substrate via the fuse resistor flows to the first main electrode,
a control element is provided in the semiconductor substrate to control a longitudinal device, and
in a case where the cutting current flows, the control element is set to a non-conduction state.

6. The trimming method according to claim 3, wherein a control element is provided in the semiconductor substrate to control a longitudinal device, and
in a case where the cutting current flows, the control element is set to a non-conduction state.

7. The trimming method according to claim 4, wherein a control element is provided in the semiconductor substrate to control a longitudinal device, and
in a case where the cutting current flows, the control element is set to a non-conduction state.

8. The trimming method according to claim 2, wherein the longitudinal device is a MOSFET.

9. The trimming method according to claim 3, wherein a longitudinal device is a MOSFET.

10. The trimming method according to claim 4, wherein a longitudinal device is a MOSFET.

11. The trimming method according to claim 5, wherein the longitudinal device is a MOSFET.

* * * * *